(12) United States Patent
Yamazaki

(10) Patent No.: US 10,115,830 B2
(45) Date of Patent: Oct. 30, 2018

(54) SEMICONDUCTOR DEVICE, MANUFACTURING METHOD THEREOF, AND ELECTRONIC DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/808,246

(22) Filed: Jul. 24, 2015

(65) Prior Publication Data

US 2016/0035896 A1 Feb. 4, 2016

(30) Foreign Application Priority Data

Jul. 29, 2014 (JP) .................. 2014-153753

(51) Int. Cl.
*H01L 21/336* (2006.01)
*H01L 29/786* (2006.01)
(Continued)

(52) U.S. Cl.
CPC ........ *H01L 29/7869* (2013.01); *H01L 27/127* (2013.01); *H01L 29/66969* (2013.01); *H01L 27/1225* (2013.01); *H01L 29/24* (2013.01)

(58) Field of Classification Search
CPC .............. H01L 29/24; H01L 29/41733; H01L 29/6659; H01L 29/66969; H01L 29/78618;
(Continued)

(56) References Cited

U.S. PATENT DOCUMENTS 4,704,367 A * 11/1987 Alvis .................. H01L 21/3215
148/DIG. 140
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Eric Ward
(74) *Attorney, Agent, or Firm* — Fish & Richardson P.C.

(57) ABSTRACT

A gate insulating film is formed over an oxide semiconductor film. A gate electrode is formed over the gate insulating film. An interlayer insulating film is formed over the oxide semiconductor film and the gate electrode. Planarization treatment is performed on the interlayer insulating film. An opening is formed in the interlayer insulating film subjected to the planarization treatment. A conductive film is formed in the opening and over the interlayer insulating film subjected to the planarization treatment. A pair of conductive films is formed by performing planarization treatment on the conductive film. A first region and a second region are formed in the oxide semiconductor film by adding an impurity to the pair of conductive films. The second region and the opening overlap with each other. The second region is formed by an impact caused by addition of the impurity to the pair of conductive films.

13 Claims, 29 Drawing Sheets

(51) Int. Cl.
*H01L 29/66* (2006.01)
*H01L 29/24* (2006.01)
*H01L 27/12* (2006.01)

(58) Field of Classification Search
CPC .......... H01L 29/7869; H01L 27/10873; H01L 27/1225; H01L 21/02554; H01L 21/02565; H01L 21/823814
See application file for complete search history.

(56) References Cited

U.S. PATENT DOCUMENTS

| | | | |
|---|---|---|---|
| 5,744,864 A | 4/1998 | Cillessen et al. | |
| 5,882,738 A * | 3/1999 | Blish, II | C23C 14/48 257/E21.584 |
| 6,071,807 A * | 6/2000 | Watanabe | H01L 21/31155 257/E21.248 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 * | 10/2007 | Hoffman | H01L 29/7869 257/59 |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,110,833 B2 * | 2/2012 | Kuriyagawa | H01L 29/458 257/100 |
| 8,395,148 B2 | 3/2013 | Yamazaki et al. | |
| 8,481,377 B2 | 7/2013 | Akimoto et al. | |
| 8,643,008 B2 | 2/2014 | Yamazaki et al. | |
| 8,796,681 B2 | 8/2014 | Yamade et al. | |
| 8,916,424 B2 | 12/2014 | Isobe et al. | |
| 8,951,899 B2 | 2/2015 | Yamade et al. | |
| 9,012,993 B2 | 4/2015 | Yamazaki | |
| 9,048,265 B2 | 6/2015 | Hondo et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan | |
| 2008/0197356 A1 * | 8/2008 | Kim | H01L 27/12 257/71 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0147738 A1 | 6/2011 | Yamazaki et al. | |
| 2011/0240998 A1 | 10/2011 | Morosawa et al. | |
| 2012/0315730 A1 * | 12/2012 | Koezuka | H01L 29/78618 438/158 |
| 2013/0032804 A1 * | 2/2013 | Kim | H01L 27/1255 257/59 |
| 2013/0069132 A1 | 3/2013 | Atsumi et al. | |
| 2013/0105792 A1 | 5/2013 | Yamazaki et al. | |
| 2013/0112972 A1 * | 5/2013 | Koike | H01L 29/45 257/43 |
| 2013/0137255 A1 * | 5/2013 | Yamade | H01L 21/265 438/530 |
| 2014/0374746 A1 * | 12/2014 | Lee | H01L 29/66969 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220817 A | 8/2007 |
| JP | 2011-228622 A | 11/2011 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A). May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

(56) References Cited

OTHER PUBLICATIONS

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner cross-sectional view of pellet top view of pellet

SEMICONDUCTOR DEVICE, MANUFACTURING METHOD THEREOF, AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device, a display device, a light-emitting device, a power storage device, a memory device, an imaging device, a driving method thereof, or a manufacturing method thereof. Furthermore, in particular, one embodiment of the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

A transistor including an oxide semiconductor is required to have excellent electrical characteristics for application to semiconductor devices with higher performance. For example, a transistor having a self-aligned structure, in which a gate electrode and a gate insulating film are formed over a region of an oxide semiconductor film serving as a channel formation region of the transistor, and a source region and a drain region are formed in such a manner that the resistance of a region of the oxide semiconductor film that is covered with neither the gate electrode nor the gate insulating film is reduced, is reported (see, for example, Patent Document 1 and Patent Document 2).

REFERENCE

[Patent Document 1] Japanese Published Patent Application No. 2007-220817

[Patent Document 2] Japanese Published Patent Application No. 2011-228622

SUMMARY OF THE INVENTION

An object of one embodiment of the present invention is to provide a self-aligned semiconductor device including an oxide semiconductor film that has excellent electrical characteristics. Another object of one embodiment of the present invention is to provide a method for manufacturing a semiconductor device with small variations in electrical characteristics. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a semiconductor device. The method includes the following steps: forming an oxide semiconductor film; forming a gate insulating film over the oxide semiconductor film; forming a gate electrode over the gate insulating film; forming an interlayer insulating film over the oxide semiconductor film and the gate electrode; performing planarization treatment on the interlayer insulating film; forming an opening in the interlayer insulating film subjected to the planarization treatment; forming a conductive film in the opening and over the interlayer insulating film subjected to the planarization treatment; forming a pair of conductive films by performing planarization treatment on the conductive film; and forming a first region and a second region in the oxide semiconductor film by adding an impurity to the pair of conductive films. The second region and the opening overlap with each other. The second region is formed by an impact caused by addition of the impurity to the pair of conductive films.

Another embodiment of the present invention is a method for manufacturing a semiconductor device. The method includes the following steps: forming a gate electrode; forming a gate insulating film over the gate electrode; forming an oxide semiconductor film over the gate insulating film; forming an interlayer insulating film over the oxide semiconductor film; performing planarization treatment on the interlayer insulating film; forming an opening in the interlayer insulating film subjected to the planarization treatment; forming a conductive film in the opening and over the interlayer insulating film subjected to the planarization treatment; forming a pair of conductive films by performing planarization treatment on the conductive film; and forming a first region and a second region in the oxide semiconductor film by adding an impurity to the pair of conductive films. The second region and the opening overlap with each other. The second region is formed by an impact caused by addition of the impurity to the pair of conductive films.

Furthermore, in the above manufacturing method, the impurity is preferably added by an ion doping method or an ion implantation method.

Another embodiment of the present invention is a semiconductor device including an oxide semiconductor film; a gate insulating film over the oxide semiconductor film; a gate electrode over the gate insulating film; an interlayer insulating film over the oxide semiconductor film and the gate electrode; and a pair of conductive films in contact with the oxide semiconductor film through an opening formed in the interlayer insulating film. The oxide semiconductor film includes a first region and a second region. The second region and the opening overlap with each other. The concentration of an impurity element in the second region is higher than that in the first region.

Another embodiment of the present invention is a semiconductor device including a gate electrode; a gate insulating film over the gate electrode; an oxide semiconductor film over the gate insulating film; an interlayer insulating film over the oxide semiconductor film; and a pair of conductive films in contact with the oxide semiconductor film through an opening formed in the interlayer insulating film. The oxide semiconductor film includes a first region and a second region. The second region and the opening overlap with each other. The concentration of an impurity element in the second region is higher than that in the first region.

Furthermore, in the above structure, the impurity element may include an element that is contained in the pair of conductive films.

Another embodiment of the present invention is an electronic device that includes the semiconductor device with the above structure and at least one of a display device, a microphone, a speaker, an operation key, a touch panel, and an antenna.

One embodiment of the present invention can provide a self-aligned semiconductor device including an oxide semiconductor film that has excellent electrical characteristics. According to one embodiment of the present invention, a method for manufacturing the semiconductor device with less variation can be provided. According to one embodiment of the present invention, a novel semiconductor device can be provided.

Note that the description of these effects does not disturb the existence of other effects. One embodiment of the present invention does not necessarily have all the effects listed above. Other effects will be apparent from and can be derived from the description of the specification, the drawings, the claims, and the like.

DETAILED DESCRIPTION OF THE INVENTION

Figure 1A:
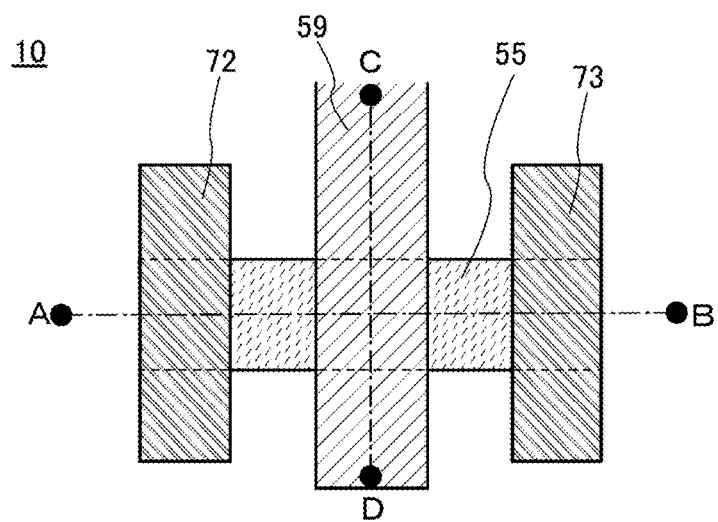
FIGS. 1A to 1C are a top view and cross-sectional views illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Note that the term such as "over" or "below" in this specification and the like does not necessarily mean that a component is placed "directly on" or "directly under" another component. For example, the expression "a gate electrode over a gate insulating film" does not preclude the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification and the like.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, a semiconductor device of one embodiment of the present invention will be described with reference to drawings.

Figure 1B:
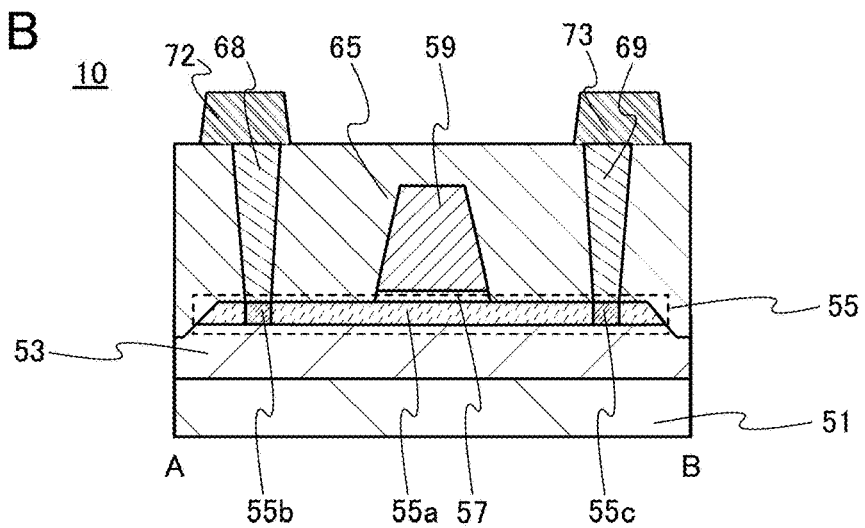
Figure 1C:
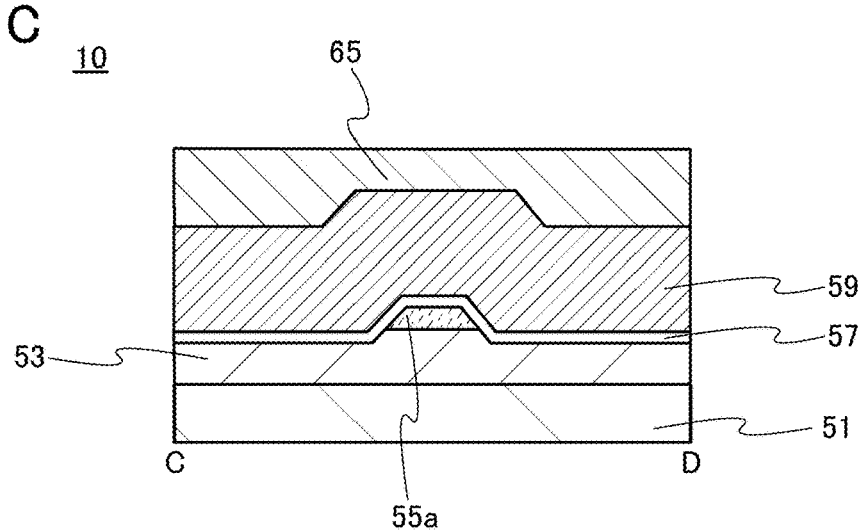

FIGS. 1A to 1C illustrate a top-gate self-aligned transistor as an example of a transistor in a semiconductor device. FIG. 1A is a top view of a transistor. FIG. 1B is a cross-sectional view taken along dashed-dotted line A-B in FIG. 1A. FIG. 1C is a cross-sectional view taken along dashed-dotted line C-D in FIG. 1A. Note that for simplification of the drawing, some components in the top view in FIG. 1A are not illustrated. In some cases, the direction of the dashed-dotted line A-B is referred to as the channel length direction, and the direction of the dashed-dotted line C-D is referred to as the channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily equal. In other words, the channel length of one transistor is not limited to one value in some cases. Therefore, in this specification, the channel length is any one of values, the maximum value, the minimum value, or the average value in a region where a channel is formed.

The channel width refers to, for example, the width of a source or a drain in a region where a semiconductor (or a portion where a current flows in a semiconductor when a transistor is on) and a gate electrode overlap with each other or a region where a channel is formed. In one transistor, channel widths in all regions are not necessarily equal. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width, which is the length of a portion where a source and a drain face each other in a region where an oxide semiconductor film and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that the channel length of a transistor is preferably greater than or equal to 5 nm and less than or equal to 200 nm, more preferably greater than or equal to 10 nm and less than or equal to 100 nm, more preferably greater than or equal to 20 nm and less than or equal to 40 nm. The channel width is preferably less than or equal to 50 nm, more preferably less than or equal to 30 nm, still more preferably less than or equal to 20 nm.

A transistor 10 illustrated in FIGS. 1A to 1C includes a substrate 51; an insulating film 53 over the substrate 51; an oxide semiconductor film 55 that is over the insulating film 53 and includes a first region 55a and second regions 55b and 55c; a gate insulating film 57 that is in contact with the oxide semiconductor film 55; a gate electrode 59 that is in contact with the gate insulating film 57 and overlaps with the first region 55a; an interlayer insulating film 65 over the oxide semiconductor film 55 and the gate electrode 59; and a pair of conductive films 68 and 69 in contact with second regions 55b and 55c in the oxide semiconductor film 55 through openings in the interlayer insulating film 65.

Furthermore, wirings 72 and 73 electrically connected to the pair of conductive films 68 and 69 may be provided in the transistor.

Oxygen vacancies are generated in the second regions 55b and 55c because of physical damage caused when the conductive films 68 and 69 are impacted by an ion doping method, an ion implantation method, a plasma immersion ion implantation method, or the like and the impact is transmitted to the oxide semiconductor film 55.

The oxygen vacancies and hydrogen in the oxide semiconductor film reduce the resistance of the second regions 55b and 55c, leading to reduction in contact resistance with the pair of conductive films 68 and 69.

Furthermore, an element contained in the pair of conductive films 68 and 69 might be mixed into the second regions 55b and 55c owing to the impact received by the conductive films 68 and 69.

Note that in adding an impurity to the pair of conductive films 68 and 69 by an ion doping method, an ion implantation method, a plasma immersion ion implantation method, or the like, controlling an acceleration voltage is important. When the acceleration voltage is too high, ions are also added to the first region; thus, the acceleration voltage needs to be appropriately adjusted in accordance with the thicknesses and materials of the interlayer insulating film 65 and the pair of conductive films 68 and 69. Furthermore, it is preferred that ions be more easily implanted into the conductive films 68 and 69 than into the interlayer insulating film 65. For example, the conductive films 68 and 69 are preferably formed using a material that easily causes channeling. Channeling is a phenomenon in which an ion beam is introduced deeply from the direction in which atoms are sparse by utilizing atomic densities that vary among the directions of crystals. When such a material is used, for example, ions can be implanted into a film with a columnar structure more deeply even at the same acceleration voltage. Note that ions may be implanted into the first region and the second regions.

The hydrogen concentration of the first region 55a, which is measured by secondary ion mass spectrometry (SIMS), is preferably higher than or equal to $7.28 \times 10^{17}$ atoms/cm$^3$ (lower measurement limit) and lower than or equal to $5 \times 10^{19}$ atoms/cm$^3$, more preferably $7.28 \times 10^{17}$ atoms/cm$^3$ and lower than or equal to $1 \times 10^{19}$ atoms/cm$^3$, still more preferably higher than or equal to $7.28 \times 10^{17}$ atoms/cm$^3$ and lower than or equal to $5 \times 10^{18}$ atoms/cm$^3$, yet still more preferably higher than or equal to $7.28 \times 10^{17}$ atoms/cm$^3$ and lower than or equal to $1 \times 10^{18}$ atoms/cm$^3$.

When the hydrogen concentration of the first region 55a is set in the range described above, generation of electrons serving as carriers in the first region 55a can be suppressed, and the transistor has a positive threshold voltage (normally-off characteristics).

When hydrogen is added to the oxide semiconductor in which oxygen vacancies are generated, hydrogen enters an oxygen vacant site and forms a donor level in the vicinity of the conduction band. As a result, the conductivity of the oxide semiconductor is increased, so that the oxide semiconductor becomes a conductor. The oxide semiconductor having become a conductor can be referred to as an oxide conductor. Oxide semiconductors generally have a visible light transmitting property because of their large energy gap. In contrast, an oxide conductor is an oxide semiconductor having a donor level in the vicinity of the conduction band. Thus, the influence of light absorption due to the donor level is small, so that an oxide conductor has a visible light transmitting property comparable to that of an oxide semiconductor.

This means that, in the transistor, the second regions 55b and 55c are each formed of an oxide conductor. In addition, the second regions 55b and 55c each function as a low-resistance region. Thus, the transistor having the structure illustrated in FIGS. 1A to 1C has a high on-state current.

In the transistor described in this embodiment, oxygen vacancies are formed in the second regions 55b and 55c and hydrogen in the oxide semiconductor film enters an oxygen vacant site. This enables the resistivity of the second regions 55b and 55c to be reduced and variations in the resistivity of the second regions 55b and 55c among transistors to be reduced. In other words, by addition of the impurity elements to the second regions 55b and 55c, the resistivity of the second regions 55b and 55c can be controlled.

The components illustrated in FIGS. 1A to 1C will be described in detail below.

Any of a variety of substrates can be used as the substrate 51 without limitation to a particular type of substrate. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of a glass substrate include a barium borosilicate glass substrate, an alumino-borosilicate glass substrate, and soda lime glass substrate. Examples of a flexible substrate, an attachment film, a base material film, and the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. In particular, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Alternatively, a flexible substrate may be used as the substrate 51, and the transistor may be provided directly on the flexible substrate. Alternatively, a separation layer may be provided between the substrate 51 and the transistor. The separation layer can be used when part or the whole of a semiconductor device formed over the separation layer is completed and separated from the substrate 51 and transferred to another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating film 53 can be formed to have a single-layer structure or a layered structure using an oxide insulating film or a nitride insulating film. Note that in the insulating film 53, an oxide insulating film is preferably used for at least a region in contact with the oxide semiconductor film 55, in order to improve the characteristics of the interface with the oxide semiconductor film 55. An oxide insulating film that releases oxygen by heating is preferably used as the insulating film 53, in which case oxygen contained in the insulating film 53 can be moved to the oxide semiconductor film 55 by heat treatment.

The insulating film 53 may be formed to have a single-layer structure or a layered structure using, for example, silicon oxide, silicon oxynitride, silicon nitride oxide, silicon nitride, aluminum oxide, hafnium oxide, gallium oxide, or Ga—Zn oxide.

The oxide semiconductor film 55 is typically formed of a metal oxide such as In—Ga oxide, In—Zn oxide, or In-M-Zn oxide (M is Al, Ga, Y, Zr, Sn, La, Ce, or Nd).

Note that in the case where the oxide semiconductor film 55 is an In-M-Zn oxide film, when the summation of In and M is assumed to be 100 atomic %, the proportions of In and M, not taking Zn and O into consideration, are preferably as follows: the proportion of In is greater than 25 atomic % and the proportion of M is less than 75 atomic %, more preferably, the proportion of In is greater than 34 atomic % and the proportion of M is less than 66 atomic %.

The energy gap of the oxide semiconductor film 55 is 2 eV or more, preferably 2.5 eV or more, more preferably 3 eV or more.

The thickness of the oxide semiconductor film 55 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the oxide semiconductor film 55 is an In-M-Zn oxide film (M is Al, Ga, Y, Zr, Sn, La, Ce, or Nd), it is preferred that the atomic ratio of metal elements of a sputtering target used to form the In-M-Zn oxide film satisfy the following: In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, or the like is preferable. Note that the proportion of each metal element in the atomic ratio of the oxide semiconductor film 55 to be formed varies within a range of ±40% of that in the above atomic ratio of the sputtering target as an error.

When silicon or carbon, which is an element belonging to Group 14, is contained in the oxide semiconductor film 55, oxygen vacancies are increased in the oxide semiconductor film 55, and the oxide semiconductor film 55 becomes an n-type film. Thus, the concentration of silicon or carbon in the oxide semiconductor film 55 (the concentration measured by SIMS) is higher than or equal to $6.64 \times 10^{16}$ atoms/cm$^3$ (lower measurement limit) and lower than or equal to $2 \times 10^{18}$ atoms/cm$^3$, preferably higher than or equal to $6.64 \times 10^{16}$ atoms/cm$^3$ and lower than or equal to $2 \times 10^{17}$ atoms/cm$^3$. As a result, the transistor has a positive threshold voltage (normally-off characteristics).

The concentration of alkali metal or alkaline earth metal in the oxide semiconductor film 55, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, increasing the off-state current of the transistor. Thus, it is preferred that the concentration of alkali metal or alkaline earth metal in the oxide semiconductor film 55 be reduced. In that case, the transistor has positive threshold voltage (normally-off characteristics).

In addition, when nitrogen is contained in the oxide semiconductor film 55, electrons serving as carriers are generated to increase the carrier density, so that the oxide semiconductor film 55 easily becomes an n-type film. Thus, a transistor including an oxide semiconductor that contains nitrogen is likely to be normally on. For this reason, nitrogen in the oxide semiconductor film is preferably reduced as much as possible. The concentration of nitrogen measured by SIMS is preferably set to, for example, higher than or equal to $5.4 \times 10^{16}$ atoms/cm$^3$ (lower measurement limit) and lower than or equal to $5 \times 10^{18}$ atoms/cm$^3$.

When impurities in the oxide semiconductor film 55 are reduced, the carrier density in the oxide semiconductor film can be lowered. The carrier density in the oxide semiconductor film 55 is preferably greater than or equal to $1 \times 10^{-9}$/cm$^3$ and less than or equal to $1 \times 10^{17}$/cm$^3$, more preferably less than or equal to $1 \times 10^{15}$/cm$^3$, still more preferably less than or equal to $1 \times 10^{13}$/cm$^3$, or yet still more preferably less than or equal to $1 \times 10^{11}$/cm$^3$.

An oxide semiconductor film having a low impurity concentration and a low density of defect states can be used as the oxide semiconductor film 55, in which case the transistor can have more excellent electric characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including a channel region in the oxide semiconductor film is likely to have positive threshold voltage (normally-off characteristics). A highly purified intrinsic or substantially highly purified intrinsic oxide semiconductor film has a low density of defect states and accordingly has few carrier traps in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode in the range from 1 V to 10 V. Thus, the transistor whose channel region is formed in the oxide semiconductor film has a small variation in electric characteristics and high reliability in some cases.

The structure of the oxide semiconductor film will be described below.

An oxide semiconductor film is classified into a single crystal oxide semiconductor film and a non-single-crystal oxide semiconductor film, for example. Alternatively, an oxide semiconductor film is classified into a crystalline oxide semiconductor film and an amorphous oxide semiconductor film, for example.

Examples of the non-single-crystal oxide semiconductor film include a c-axis aligned crystalline oxide semiconductor (CAAC-OS) film, a polycrystalline oxide semiconductor film, a microcrystalline oxide semiconductor film, and an amorphous oxide semiconductor film. Examples of the crystalline oxide semiconductor film include a single crystal oxide semiconductor film, a CAAC-OS film, a polycrystalline oxide semiconductor film, and a microcrystalline oxide semiconductor film.

First, a CAAC-OS film will be described.

A CAAC-OS film is one of oxide semiconductor films having a plurality of c-axis aligned crystal parts (also referred to as pellets).

In a combined analysis image (also referred to as a high-resolution TEM image) of a bright-field image and a diffraction pattern of a CAAC-OS film, which is obtained using a transmission electron microscope (TEM), a plurality of pellets can be observed. However, in the high-resolution TEM image, a boundary between pellets, that is, a grain boundary is not clearly observed. Thus, in the CAAC-OS film, a reduction in electron mobility due to the grain boundary is less likely to occur.

Figure 2A:
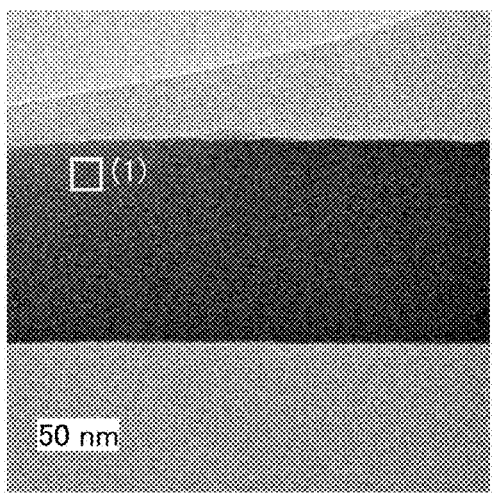
FIGS. 2A to 2D are Cs-corrected high-resolution TEM images of a cross section of a CAAC-OS and a cross-sectional schematic view of a CAAC-OS.

For example, FIG. 2A shows a high-resolution TEM image of a cross section of the CAAC-OS film which is observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 2B:
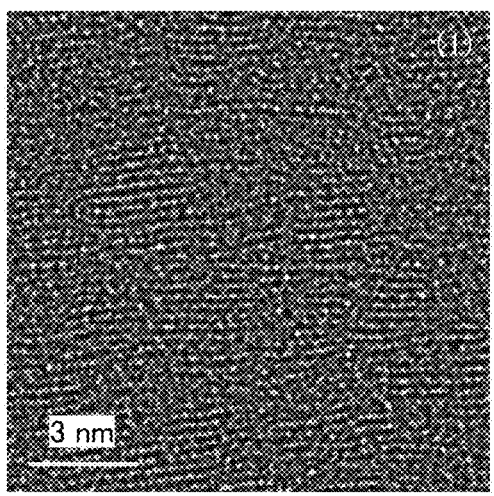

FIG. 2B is an enlarged Cs-corrected high-resolution TEM image of a region (1) in FIG. 2A. FIG. 2B shows that metal atoms are arranged in a layered manner in a pellet. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

Figure 2C:
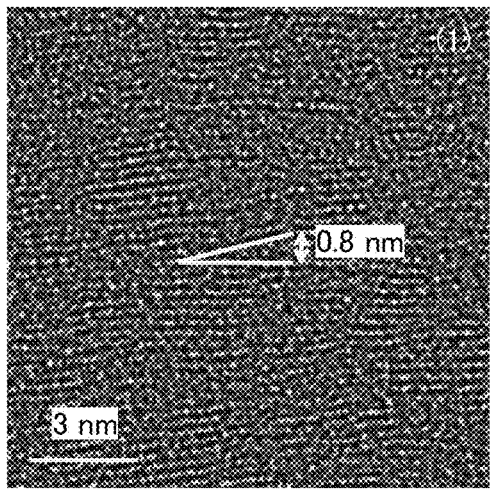

As shown in FIG. 2B, the CAAC-OS film has a characteristic atomic arrangement. The characteristic atomic arrangement is denoted by an auxiliary line in FIG. 2C. FIGS. 2B and 2C prove that the size of a pellet is approximately 1 nm to 3 nm, and the size of a space caused by the tilt of the pellets is approximately 0.8 nm. Therefore, the pellet can also be referred to as a nanocrystal (nc).

Figure 2D:
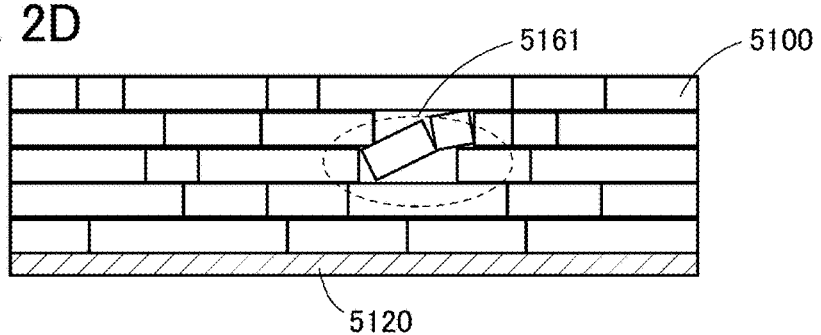

Here, according to the Cs-corrected high-resolution TEM images, the schematic arrangement of pellets 5100 of a CAAC-OS film over a substrate 5120 is illustrated by such a structure in which bricks or blocks are stacked (see FIG. 2D). The part in which the pellets are tilted as observed in FIG. 2C corresponds to a region 5161 illustrated in FIG. 2D.

Figure 3A:
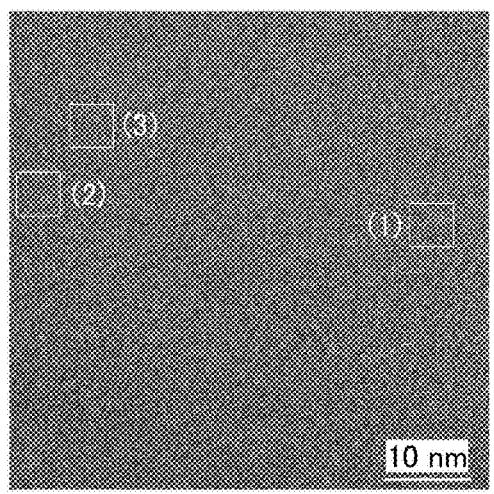
FIGS. 3A to 3D are Cs-corrected high-resolution TEM images of a plane of a CAAC-OS.
Figure 3B:
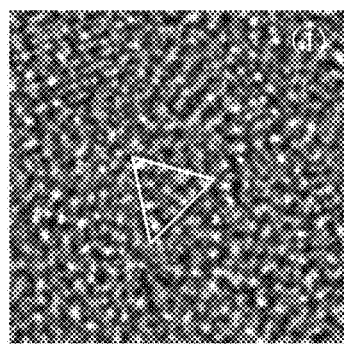
Figure 3C:
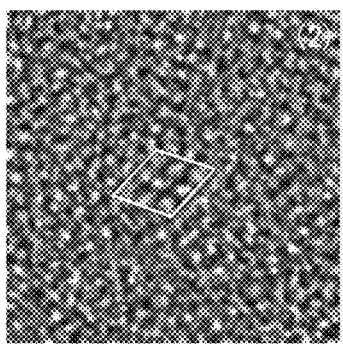
Figure 3D:
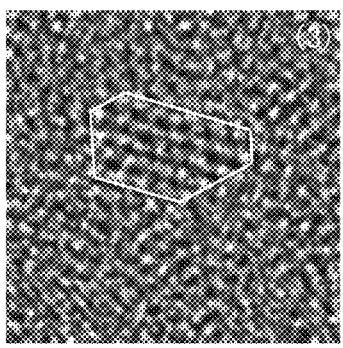

FIG. 3A shows a Cs-corrected high-resolution TEM image of a plane of the CAAC-OS film observed from the direction substantially perpendicular to the sample surface. FIGS. 3B, 3C, and 3D are enlarged Cs-corrected high-resolution TEM images of regions (1), (2), and (3) in FIG. 3A, respectively. FIGS. 3B, 3C, and 3D indicate that metal atoms are arranged in a triangular, quadrangular, or hexagonal configuration in a pellet. However, there is no regularity of arrangement of metal atoms between different pellets.

Figure 4A:
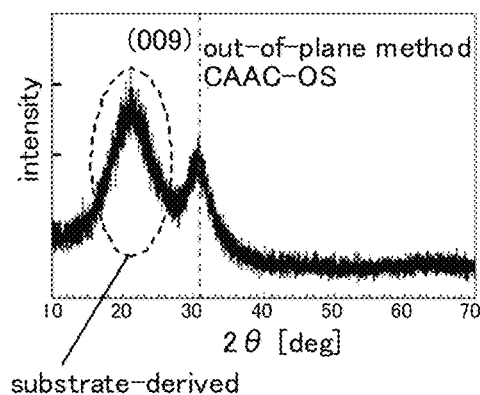
FIGS. 4A to 4C show structural analysis of a CAAC-OS and a single crystal oxide semiconductor by XRD.

For example, when the structure of a CAAC-OS film including an InGaZnO$_4$ crystal is analyzed by an out-of-plane method using an X-ray diffraction (XRD) analyzer, a peak appears at a diffraction angle (2θ) of around 31° as shown in FIG. 4A. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

Note that in structural analysis of the CAAC-OS film including the InGaZnO$_4$ crystal by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferred that in the CAAC-OS film, a peak appear when 2θ is around 31° and that a peak not appear when 2θ is around 36°.

Figure 4B:
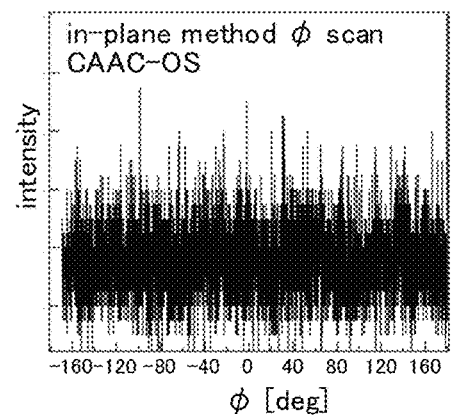
Figure 4C:
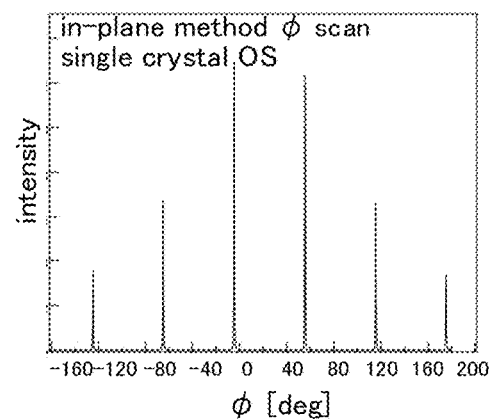

On the other hand, in structural analysis of the CAAC-OS film by an in-plane method in which an X-ray is incident on a sample in the direction substantially perpendicular to the c-axis, a peak appears when 2θ is around 56°. This peak is attributed to the (110) plane of the InGaZnO$_4$ crystal. In the case of the CAAC-OS film, when analysis (φ scan) is performed with 2θ fixed at around 56° and with the sample rotated using a normal vector of the sample surface as an axis (φ axis), as shown in FIG. 4B, a peak is not clearly observed. In contrast, in the case of a single crystal oxide semiconductor of InGaZnO$_4$, when φ scan is performed with 2θ fixed at around 56°, as shown in FIG. 4C, six peaks which are derived from crystal planes equivalent to the (110) plane are observed. Accordingly, the structural analysis using XRD shows that the directions of a-axes and b-axes are irregularly oriented in the CAAC-OS film.

Figure 5A:
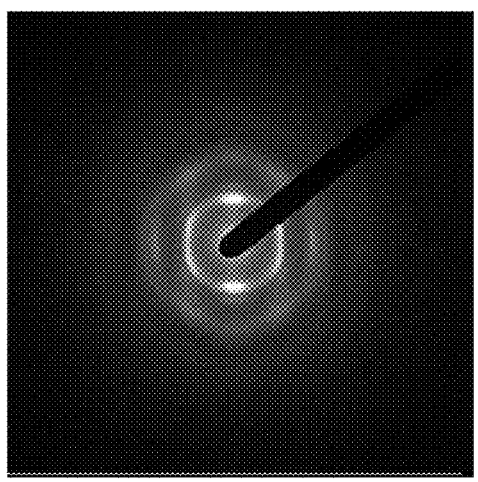
FIGS. 5A and 5B show electron diffraction patterns of a CAAC-OS.
Figure 5B:
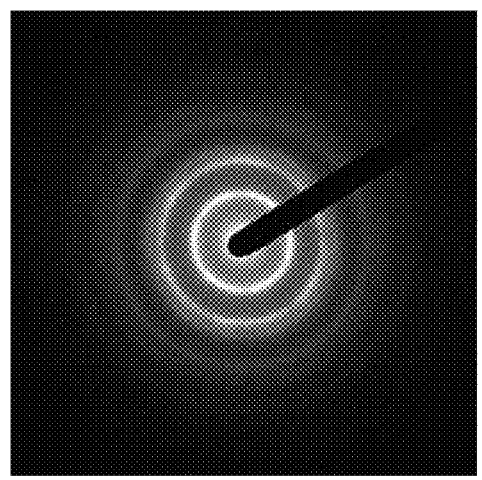

Next, FIG. 5A shows a diffraction pattern (also referred to as a selected-area transmission electron diffraction pattern) obtained when an electron beam with a probe diameter of 300 nm is incident on an In—Ga—Zn oxide, which is a CAAC-OS film, in the direction parallel to the sample surface. In FIG. 5A, spots derived from the (009) plane of an InGaZnO$_4$ crystal are observed. Thus, the electron diffraction also indicates that pellets included in the CAAC-OS film have c-axis alignment and that the c-axes are aligned in the direction substantially perpendicular to the formation surface or the top surface of the CAAC-OS film. Meanwhile, FIG. 5B shows a diffraction pattern obtained in such a manner that an electron beam with a probe diameter of 300 nm is incident on the same sample in the direction perpendicular to the sample surface. As shown in FIG. 5B, a ring-like diffraction pattern is observed. Thus, the electron diffraction also indicates that the a-axes and b-axes of the pellets included in the CAAC-OS film do not have regular alignment. The first ring in FIG. 5B is considered to be derived from the (010) plane, the (100) plane, and the like of the InGaZnO$_4$ crystal. The second ring in FIG. 5B is considered to be derived from the (110) plane and the like.

Since the c-axes of the pellets (nanocrystals) are aligned in the direction substantially perpendicular to the formation surface or the top surface in the above manner, the CAAC- OS film can also be referred to as an oxide semiconductor including c-axis aligned nanocrystals (CANC).

The CAAC-OS film is an oxide semiconductor film with a low impurity concentration. The impurity means an element other than the main components of the oxide semiconductor film, such as hydrogen, carbon, silicon, or a transition metal element. An element (specifically, silicon or the like) having higher strength of being bonded to oxygen than a metal element contained in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

Moreover, the CAAC-OS film is an oxide semiconductor film having a low density of defect states. For example, oxygen vacancies in the oxide semiconductor film serve as carrier traps or serve as carrier generation sources when hydrogen is captured therein.

In a transistor using the CAAC-OS film, change in electrical characteristics due to irradiation with visible light or ultraviolet light is small.

Next, a microcrystalline oxide semiconductor will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases. Note that there is a possibility that the origin of the nanocrystal is the same as that of a pellet in a CAAC-OS film. Therefore, a crystal part of the nc-OS film may be referred to as a pellet in the following description.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS film when an electron beam having a probe diameter close to or smaller than the size of a pellet is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since there is no regularity of crystal orientation between the pellets (nanocrystals) as mentioned above, the nc-OS film can also be referred to as an oxide semiconductor film including non-aligned nanocrystals (NANC).

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different pellets in the nc-OS film. Therefore, the nc-OS film has a higher density of defect states than the CAAC-OS film.

Next, an amorphous oxide semiconductor film will be described.

The amorphous oxide semiconductor film is an oxide semiconductor film having disordered atomic arrangement and no crystal part and exemplified by an oxide semiconductor film that exists in an amorphous state, such as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak that shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

There are various understandings of an amorphous structure. For example, a structure whose atomic arrangement does not have ordering at all may be called a completely amorphous structure. Meanwhile, a structure that has ordering within the nearest neighbor atomic distance or the second-nearest neighbor atomic distance but does not have long-range ordering is also called an amorphous structure. Therefore, the strictest definition does not permit an oxide semiconductor film to be called an amorphous oxide semiconductor film as long as even a negligible degree of ordering is present in an atomic arrangement. At least an oxide semiconductor film having long-term ordering cannot be called an amorphous oxide semiconductor film. Accordingly, because of the presence of crystal part, for example, a CAAC-OS film and an nc-OS film cannot be called an amorphous oxide semiconductor film or a completely amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed.

A difference in effect of electron irradiation between structures of an oxide semiconductor film will be described below.

An a-like OS film, an nc-OS film, and a CAAC-OS film are prepared. Each of the samples is an In—Ga—Zn oxide.

First, a high-resolution cross-sectional TEM image of each sample is obtained. The high-resolution cross-sectional TEM images show that all the samples have crystal parts.

Figure 6:
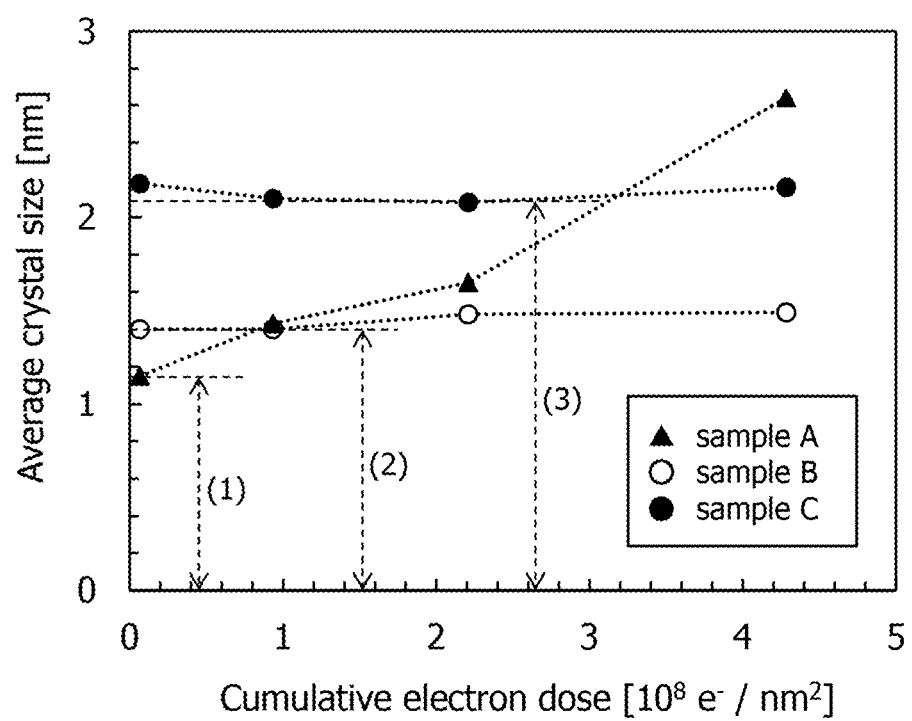
FIG. 6 shows a change in a crystal part of an In—Ga—Zn oxide by electron irradiation.

Then, the size of the crystal part of each sample is measured. FIG. 6 shows the change in the average size of crystal parts (at 22 points to 45 points) in each sample. FIG. 6 indicates that the crystal part size in the a-like OS film increases with an increase in the cumulative electron dose. Specifically, as shown by (1) in FIG. 6, a crystal part of approximately 1.2 nm at the start of TEM observation grows to a size of approximately 2.6 nm at a cumulative electron dose of $4.2 \times 10^8$ e$^-$/nm$^2$. In contrast, the crystal part size in the nc-OS film and the CAAC-OS film shows little change from the start of electron irradiation to a cumulative electron dose of $4.2 \times 10^8$ e/nm$^2$ regardless of the cumulative electron dose. Specifically, as shown by (2) in FIG. 6, the average crystal size is approximately 1.4 nm regardless of the observation time by TEM. Furthermore, as shown by (3) in FIG. 6, the average crystal size is approximately 2.1 nm regardless of the observation time by TEM.

In this manner, growth of the crystal part occurs due to the crystallization of the a-like OS film, which is induced by a slight amount of electron beam employed in the TEM observation. In contrast, in the nc-OS film and the CAAC-OS film that have good quality, crystallization hardly occurs by a slight amount of electron beam used for TEM observation.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

Furthermore, the density of an oxide semiconductor film depends on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

Specific examples of the above description will be given. For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stack including two or more of an amorphous oxide semiconductor film, an a-like OS film, a microcrystalline oxide semiconductor film, and a CAAC-OS film, for example.

An oxide semiconductor film having a low impurity concentration and a low density of defect states (a small number of oxygen vacancies) can have low carrier density. Therefore, such an oxide semiconductor film is referred to as a highly purified intrinsic or substantially highly purified intrinsic oxide semiconductor film. A CAAC-OS film and an nc-OS film have a low impurity concentration and a low density of defect states as compared to an a-like OS film and an amorphous oxide semiconductor film. That is, a CAAC-OS film and an nc-OS film are likely to be highly purified intrinsic or substantially highly purified intrinsic oxide semiconductor films. Thus, a transistor including a CAAC-OS film or an nc-OS film rarely has a negative threshold voltage (is rarely normally on). The highly purified intrinsic or substantially highly purified intrinsic oxide semiconductor film has few carrier traps. Therefore, a transistor including a CAAC-OS film or an nc-OS film has small variation in electrical characteristics and high reliability. Charge trapped by the carrier traps in the oxide semiconductor film takes a long time to be released. The trapped charge may behave like a fixed charge. Thus, the transistor which includes the oxide semiconductor film having a high impurity concentration and a high density of defect states might have unstable electrical characteristics.

<Deposition Model>

Examples of deposition models of a CAAC-OS film and an nc-OS film will be described below.

Figure 7A:
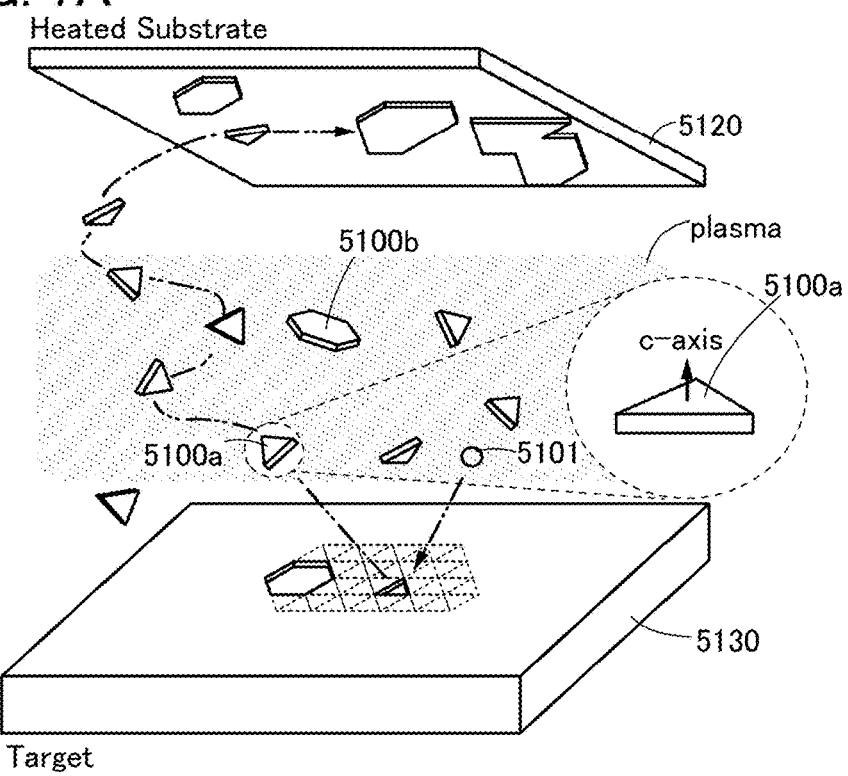
FIGS. 7A and 7B are schematic views illustrating deposition models of a CAAC-OS and an nc-OS.

FIG. 7A is a schematic view of the inside of a deposition chamber where a CAAC-OS film is deposited by a sputtering method.

A target 5130 is attached to a backing plate. A plurality of magnets is provided to face the target 5130 with the backing plate positioned therebetween. The plurality of magnets generates a magnetic field. The above description on the deposition chamber is referred to for the layout and structure of magnets. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 8A:
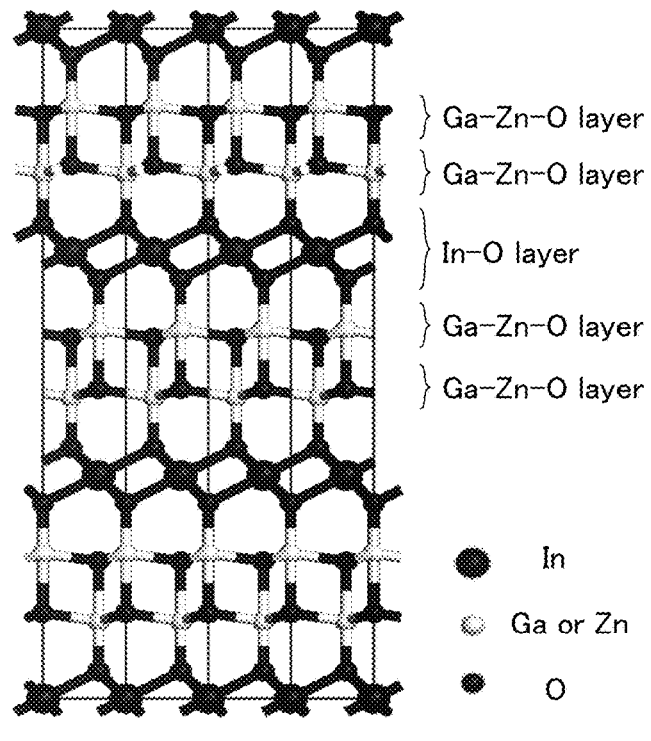
FIGS. 8A to 8C show an $InGaZnO_4$ crystal and a pellet.

A cleavage plane of the target 5130 including an In—Ga—Zn oxide will be described as an example. FIG. 8A shows a structure of an InGaZnO$_4$ crystal included in the target 5130. Note that FIG. 8A shows a structure of the case where the InGaZnO$_4$ crystal is observed from the direction parallel to the b-axis when the c-axis is in the upward direction.

FIG. 8A indicates that oxygen atoms in a Ga—Zn—O layer are positioned close to those in an adjacent Ga—Zn—O layer. The oxygen atoms have negative charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a certain voltage or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100a and a pellet 5100b that are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., a regular triangle plane. The pellet 5100b is a flat-plate-like (pellet-like) sputtered particle having a hexagonal plane, e.g., regular hexagonal plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 8B:
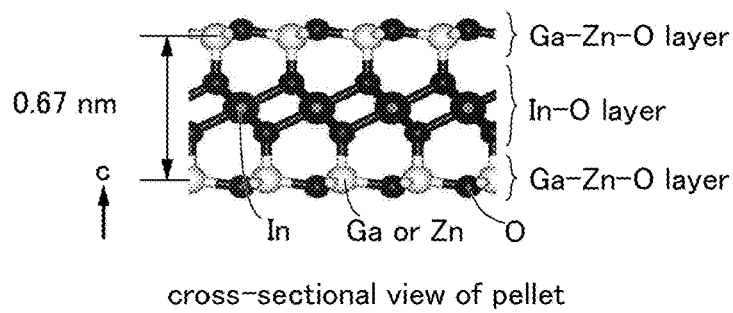
Figure 8C:
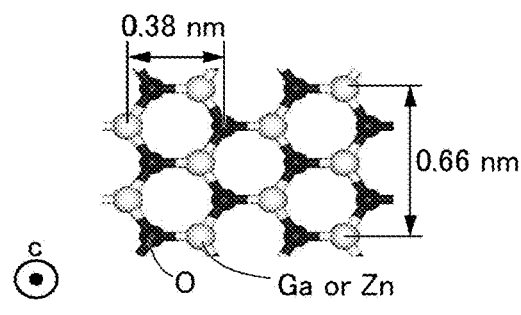

The thickness of the pellet 5100 is determined depending on the kind of deposition gas and the like. The thicknesses of the pellets 5100 are preferably uniform; the reason for this will be described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 6. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 8B is ejected. Note that FIG. 8C shows the structure of the pellet 5100 observed from the direction parallel to the c-axis. Therefore, the pellet 5100 has a nanometer-sized sandwich structure including two Ga—Zn—O layers (pieces of bread) and an In—O layer (filling).

The pellet 5100 may receive charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, charges repel each other, and accordingly, the pellet 5100 can maintain a flat-plate shape. In the case where a CAAC-OS film is an In—Ga—Zn oxide film, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. The amount of growth in plasma corresponds to a difference in size between (2) and (1) in FIG. 6. Here, in the case where the temperature of the substrate 5120 is at around room temperature, the pellet 5100 does not grow anymore; thus, an nc-OS film is formed (see FIG. 7B). An nc-OS film can be deposited when the substrate 5120 has a large size because a temperature at which the formation of an nc-OS film is carried out is approximately room temperature. Note that in order that the pellet 5100 grows in plasma, it is effective to increase deposition power in a sputtering method. High deposition power can stabilize the structure of the pellet 5100.

Figure 7B:
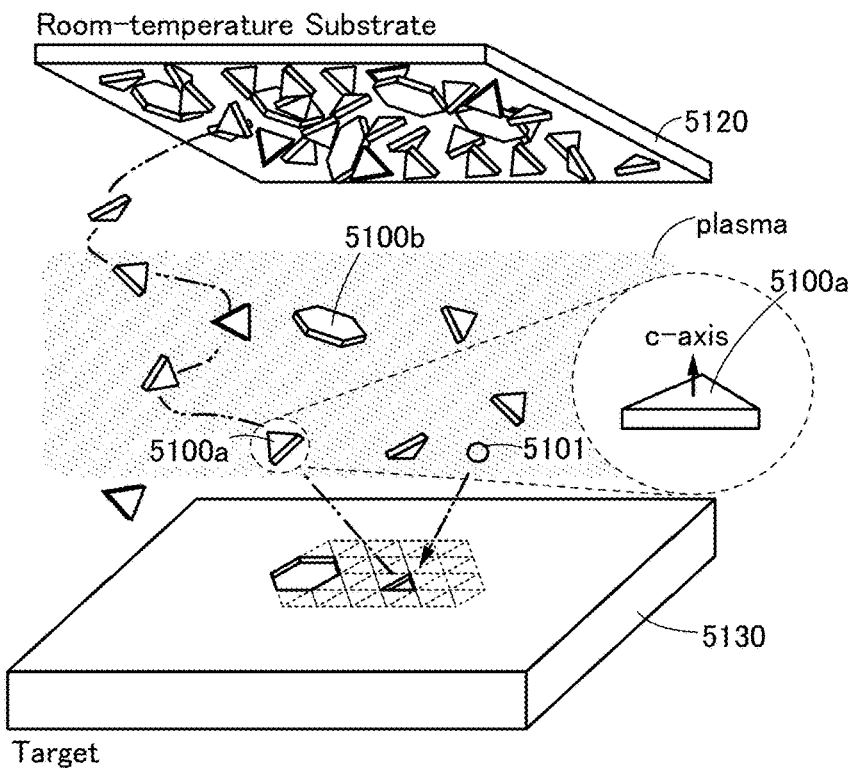

As shown in FIGS. 7A and 7B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in the direction parallel to the top surface of the substrate 5120 (also referred to as a horizontal magnetic field) is generated. A potential difference is given between the substrate 5120 and the target 5130, and accordingly, a current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and a current. In order to increase a force applied to the pellet 5100, it is preferable to provide, on the top surface, a region where the magnetic field in the direction parallel to the top surface of the substrate 5120 is 10 G or higher, preferably 20 G or higher, more preferably 30 G or higher, still more preferably 50 G or higher. Alternatively, it is preferable to provide, on the top surface, a region where the magnetic field in the direction parallel to the top surface of the substrate 5120 is 1.5 times or higher, preferably twice or higher, more preferably 3 times or higher, still more preferably 5 times or higher as high as the magnetic field in the direction perpendicular to the top surface of the substrate 5120.

At this time, the magnet units and/or the substrate 5120 is moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 7A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in the state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS film might be filled; thus, the CAAC-OS film has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to form a CAAC-OS film.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS film does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS film owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 9A to 9D are cross-sectional schematic views.

Figure 9A:
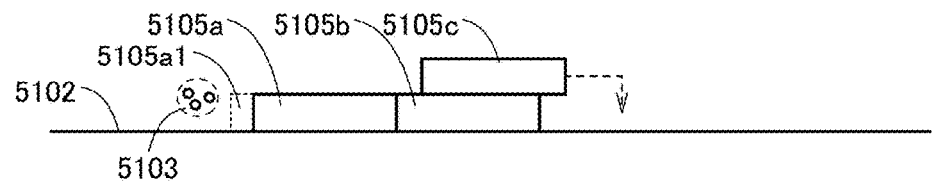
FIGS. 9A to 9D are schematic views illustrating a deposition model of a CAAC-OS.

As illustrated in FIG. 9A, a pellet 5105*a* and a pellet 5105*b* are deposited over the zinc oxide layer 5102. Here, side surfaces of the pellet 5105*a* and the pellet 5105*b* are in contact with each other. In addition, a pellet 5105*c* is deposited over the pellet 5105*b*, and then glides over the pellet 5105*b*. Furthermore, a plurality of particles 5103 ejected from the target together with the zinc oxide is crystallized by heating of the substrate 5120 to form a region 5105*a*1 on another side surface of the pellet 5105*a*. Note that the plurality of particles 5103 may contain oxygen, zinc, indium, gallium, or the like.

Figure 9B:
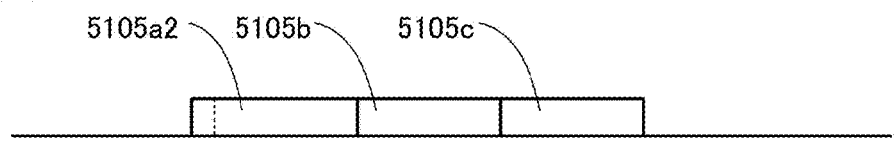

Then, as illustrated in FIG. 9B, the region 5105*a*1 grows to part of the pellet 5105*a* to form a pellet 5105*a*2. In addition, a side surface of the pellet 5105*c* is in contact with another side surface of the pellet 5105*b*.

Figure 9C:
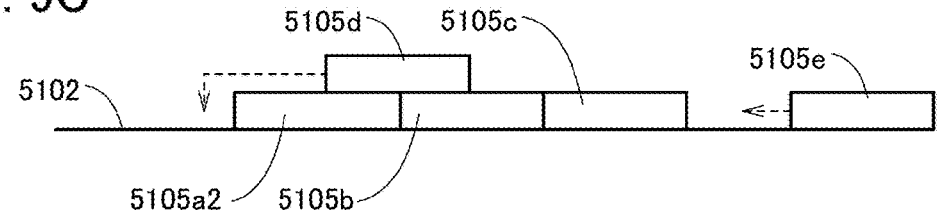

Next, as illustrated in FIG. 9C, a pellet 5105*d* is deposited over the pellet 5105*a*2 and the pellet 5105*b*, and then glides over the pellet 5105*a*2 and the pellet 5105*b*. Furthermore, a pellet 5105*e* glides toward another side surface of the pellet 5105*c* over the zinc oxide layer 5102.

Figure 9D:
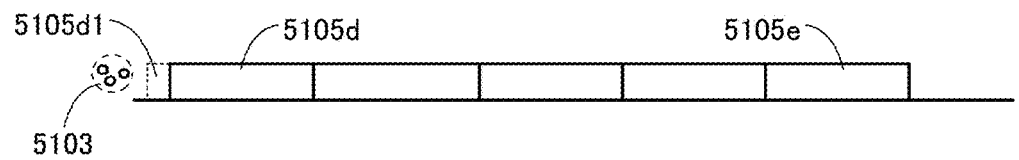

Then, as illustrated in FIG. 9D, the pellet 5105*d* is placed so that a side surface of the pellet 5105*d* is in contact with a side surface of the pellet 5105*a*2. Furthermore, a side surface of the pellet 5105*e* is in contact with another side surface of the pellet 5105*c*. A plurality of particles 5103 ejected from the target together with the zinc oxide is crystallized by heating of the substrate 5120 to form a region 5105*d*1 on another side surface of the pellet 5105*d*.

As described above, deposited pellets are placed to be in contact with each other and then growth is caused at side surfaces of the pellets, whereby a CAAC-OS film is formed over the substrate 5120. Therefore, each pellet of the CAAC-OS film is larger than that of the nc-OS film. The amount of growth corresponds to a difference in size between (3) and (2) in FIG. 6.

When spaces between pellets 5100 are extremely small, the pellets may apparently form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS film can be formed even when a formation surface does not have a crystal structure, which is different from film formation by epitaxial growth. For example, even when the top surface (formation surface) of the substrate 5120 has an amorphous structure (e.g., the top surface is formed of amorphous silicon oxide), a CAAC-OS film can be formed.

In addition, it is found that in formation of the CAAC-OS film, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards; thus, a layer with a uniform thickness, flatness, and high crystallinity is formed. By stacking n layers (n is a natural number), the CAAC-OS film can be obtained.

In the case where the top surface of the substrate 5120 has unevenness, a CAAC-OS film in which n layers (n is a natural number) in each of which the pellets 5100 are arranged along the projected surface are stacked is formed. Since the substrate 5120 has unevenness, a gap is easily generated between the pellets 5100 in the CAAC-OS film in some cases. Note that owing to intermolecular force, the pellets 5100 are arranged so that a gap between the pellets is as small as possible even on the unevenness surface. Therefore, even when the formation surface has unevenness, a CAAC-OS film with high crystallinity can be obtained.

As a result, laser crystallization is not needed for formation of a CAAC-OS film, and a uniform film can be formed even over a large-sized glass substrate or the like.

Since a CAAC-OS film is formed in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS film with high crystallinity can be formed even on a formation surface with an amorphous structure.

The gate insulating film 57 can be formed to have a single-layer structure or a layered structure using an oxide insulating film or a nitride insulating film. Note that in the gate insulating film 57, an oxide insulating film is preferably used for at least a region in contact with the oxide semiconductor film 55, in order to improve the characteristics of the interface with the oxide semiconductor film 55. The gate insulating film 57 may be formed to have a single-layer structure or a layered structure using, for example, silicon oxide, silicon oxynitride, silicon nitride oxide, silicon nitride, aluminum oxide, hafnium oxide, gallium oxide, or Ga—Zn oxide.

Furthermore, it is possible to prevent outward diffusion of oxygen from the oxide semiconductor film 55 and entry of hydrogen, water, or the like into the oxide semiconductor film 55 from the outside by providing an insulating film having a blocking effect against oxygen, hydrogen, water, and the like as the gate insulating film 57. Examples of the insulating film having a blocking effect against oxygen, hydrogen, water, and the like include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The gate insulating film 57 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 57 is greater than or equal to 1 nm and less than or equal to 100 nm, preferably greater than or equal to 5 nm and less than or equal to 50 nm, more preferably greater than or equal to 5 nm and less than or equal to 30 nm.

The gate electrode 59 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The gate electrode 59 may have a single-layer structure or a layered structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; and a three-layer structure in which a copper film containing manganese, a copper film, and a copper film containing manganese are stacked in this order. Alternatively, an alloy film or a nitride film that contains aluminum and one or more elements selected from titanium, tantalum, tungsten, molybdenum, chromium, neodymium, and scandium may be used.

The gate electrode 59 may be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. The gate electrode 59 may have a layered structure using the above light-transmitting conductive material and the above metal element.

The interlayer insulating film 65 can be formed using the material for the insulating film 53 or the gate insulating film 57 as appropriate. The thickness of the interlayer insulating film 65 is preferably greater than or equal to 20 nm and less than or equal to 400 nm, more preferably greater than or equal to 30 nm and less than or equal to 200 nm, still more preferably greater than or equal to 40 nm and less than or equal to 150 nm.

The pair of conductive films 68 and 69 is formed to have a single-layer structure or a layered structure using any of metals such as aluminum, titanium, chromium, nickel, copper, yttrium, zirconium, molybdenum, iron, cobalt, silver, tantalum, and tungsten and an alloy containing any of these metals as a main component. For example, the following structures are given: a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; and a three-layer structure in which a copper film containing manganese, a copper film, and a copper film containing manganese are stacked in this order. Note that a transparent conductive material containing indium oxide, tin oxide, or zinc oxide may be used.

The wirings 72 and 73 can be formed using a material similar to that for the pair of conductive films 68 and 69.

Next, a method for manufacturing the transistor illustrated in FIGS. 1A to 1C will be described with reference to FIGS. 10A to 10C and FIGS. 11A to 11C.

The films included in the transistor 10 (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although a sputtering method and a plasma-enhanced chemical vapor deposition (PECVD) method are typical examples of the deposition method, a thermal CVD method may be used. As the thermal CVD method, for example, a metal organic chemical vapor deposition (MOCVD) method or an atomic layer deposition (ALD) method may be used.

Deposition by a thermal CVD method is performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by an ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced such that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated more than once until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

Figure 10A:
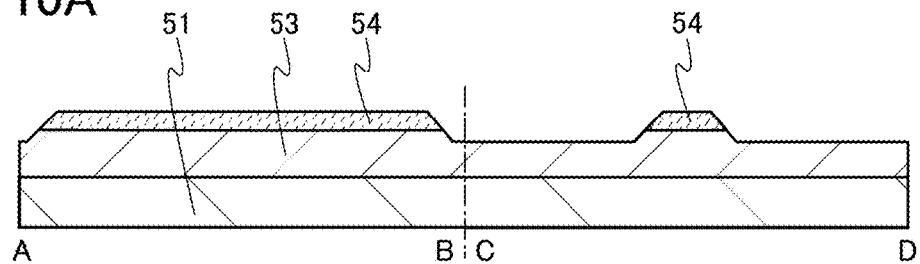
FIGS. 10A to 10C are cross-sectional views illustrating an example of a manufacturing process of a semiconductor device.

As illustrated in FIG. 10A, the insulating film 53 and an oxide semiconductor film 54 are formed over the substrate 51.

The insulating film 53 can be formed by a sputtering method, a CVD method, an evaporation method, a pulsed laser deposition (PLD) method, a printing method, a coating method, or the like as appropriate. The insulating film 53 can be formed in the following manner: an insulating film is formed over the substrate 51, and then oxygen is added to the insulating film. Examples of oxygen that can be added to the insulating film include an oxygen radical, an oxygen atom, an oxygen atomic ion, and an oxygen molecular ion. Oxygen can be added to the insulating film by, for example, an ion doping method, an ion implantation method, or plasma treatment.

A formation method of the oxide semiconductor film 54 will be described below. An oxide semiconductor film is formed over the insulating film 53 by a sputtering method, a coating method, a pulsed laser deposition method, a laser ablation method, a thermal CVD method, or the like. Then, after a mask is formed over the oxide semiconductor film by lithography, the oxide semiconductor film is partly etched using the mask. Consequently, the oxide semiconductor film 54 illustrated in FIG. 10A can be formed. After that, the mask is removed.

Alternatively, by using a printing method to form the oxide semiconductor film 54, the oxide semiconductor film 54 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

A target may be selected as appropriate in accordance with the composition of an oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the formation of the CAAC-OS film, the following conditions are preferably employed.

By suppressing entry of impurities into the CAAC-OS film during the film formation, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferred that the proportion of oxygen in the deposition gas be increased and the power be optimized in order to reduce plasma damage at the deposition. The proportion of oxygen in the deposition gas is higher than or equal to 30 vol. %, preferably 100 vol. %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferred that the above inert gas atmosphere and the above oxygen atmosphere not contain hydrogen, water, and the like. The treatment time is longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration of the oxide semiconductor film can be higher than or equal to $7.28\times10^{17}$ atoms/cm$^3$ (lower measurement limit of SIMS) and lower than or equal to $5\times10^{19}$ atoms/cm$^3$, preferably $7.28\times10^{17}$ atoms/cm$^3$ and lower than or equal to $1\times10^{19}$ atoms/cm$^3$, more preferably higher than or equal to $7.28\times10^{17}$ atoms/cm$^3$ and lower than or equal to $5\times10^{18}$ atoms/cm$^3$, still more preferably higher than or equal to $7.28\times10^{17}$ atoms/cm$^3$ and lower than or equal to $1\times10^{18}$ atoms/cm$^3$.

In the case where an oxide semiconductor film, for example, an InGaZnO$_x$ film (x>0) is formed with a deposition apparatus employing an ALD method, an In(CH$_3$)$_3$ gas and an O$_3$ gas are sequentially introduced more than once to form an InO$_2$ layer, a Ga(CH$_3$)$_3$ gas and an O$_3$ gas are sequentially introduced to form a GaO layer, and then a Zn(CH$_3$)$_2$ gas and an O$_3$ gas are sequentially introduced to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas that is obtained by bubbling with an inert gas such as Ar may be used instead of an O$_3$ gas, it is preferable to use an O$_3$ gas that does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Alternatively, a Zn(CH$_3$)$_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen. Thus, the oxide semiconductor film 54 is formed.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC is greater than or equal to 60% and less than 100%, preferably greater than or equal to 80% and less than 100%, more preferably greater than or equal to 90% and less than 100%, still more preferably greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

Figure 10B:
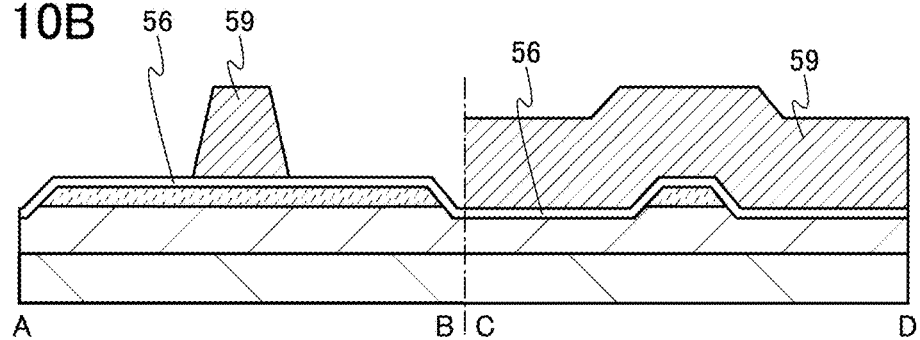

Next, as illustrated in FIG. 10B, an insulating film 56 is formed, and then the gate electrode 59 is formed.

The insulating film 56 becomes a gate insulating film in a later step. The insulating film 56 is formed by a sputtering method, a CVD method, a vacuum evaporation method, a pulsed laser deposition (PLD) method, a thermal CVD method, or the like.

In the case of forming a silicon oxide film or a silicon oxynitride film as the insulating film 56, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case of forming a gallium oxide film as the insulating film 56, a metal organic chemical vapor deposition (MOCVD) method can be employed.

In the case where a hafnium oxide film is formed as the insulating film 56 by a thermal CVD method such as an MOCVD method or an ALD method, two kinds of gases, i.e., ozone (O$_3$) as an oxidizer and a source gas that is obtained by vaporizing liquid containing a solvent and a hafnium precursor compound (hafnium alkoxide or hafnium amide such as tetrakis(dimethylamide)hafnium (TDMAH)), are used. Note that the chemical formula of tetrakis(dimethylamide)hafnium is Hf[N(CH$_3$)$_2$]$_4$. Examples of another material liquid include tetrakis(ethylmethylamide)hafnium.

In the case where an aluminum oxide film is formed as the insulating film 56 by a thermal CVD method such as an MOCVD method or an ALD method, two kinds of gases, i.e., H$_2$O as an oxidizer and a source gas that is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate). Note that an ALD method enables the insulating film 56 to have excellent coverage and small thickness.

In the case where a silicon oxide film is formed as the insulating film 56 by thermal CVD such as an MOCVD method or an ALD method, hexachlorodisilane is adsorbed on a deposition surface, chlorine contained in adsorbate is removed, and radicals of an oxidizing gas (e.g., O$_2$ or dinitrogen monoxide) are supplied to react with the adsorbate.

Here, as the insulating film 56, a silicon oxynitride film is formed by a plasma CVD method.

A formation method of the gate electrode 59 will be described below. First, a conductive film is formed by a sputtering method, a vacuum evaporation method, a pulsed laser deposition (PLD) method, a thermal CVD method, or the like, and then a mask is formed over the conductive film by photolithography. Then, part of the conductive film is etched using the mask to form the gate electrode 59. After that, the mask is removed.

Note that the gate electrode 59 may be formed by an electrolytic plating method, a printing method, an inkjet method, or the like instead of the above formation methods.

Alternatively, a tungsten film can be formed as the conductive film with a deposition apparatus employing ALD. In that case, a WF$_6$ gas and a B$_2$H$_6$ gas are sequentially introduced more than once to form an initial tungsten film, and then a WF$_6$ gas and an H$_2$ gas are sequentially introduced, so that a tungsten film is formed. Note that an SiH$_4$ gas may be used instead of a B$_2$H$_6$ gas.

Figure 10C:
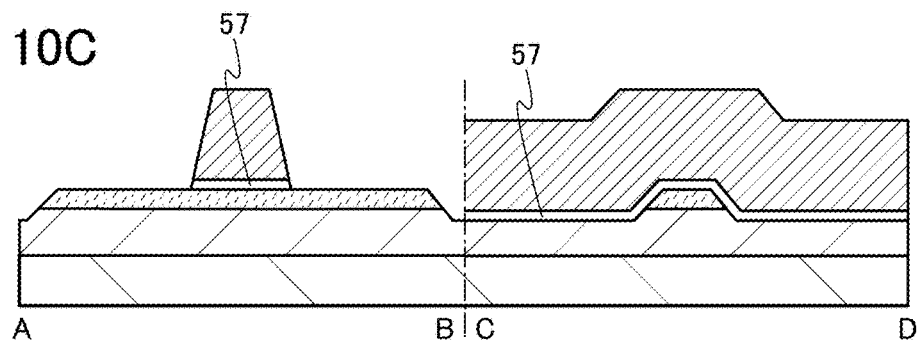
Figure 12:
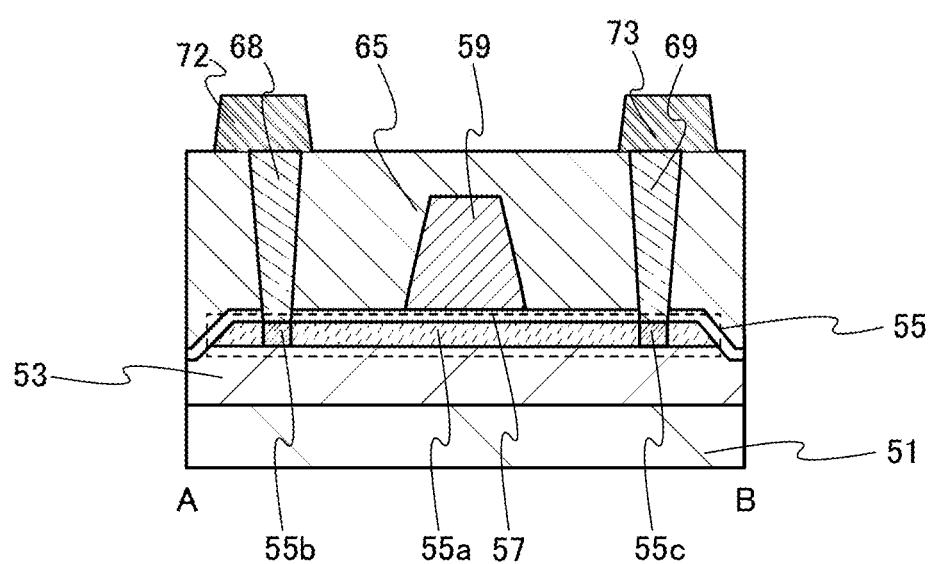
FIG. 12 is a cross-sectional view of an example of a manufacturing process of a semiconductor device.

Next, the insulating film 56 is etched using the gate electrode 59 as a mask, so that the gate insulating film 57 is formed as illustrated in FIG. 10C. Note that the insulating film 56 is not necessarily etched. In the case where the insulating film 56 is not etched, the step in FIG. 10C can be skipped. FIG. 12 is a cross-sectional view of a transistor fabricated without performing the step in FIG. 10C.

Figure 11A:
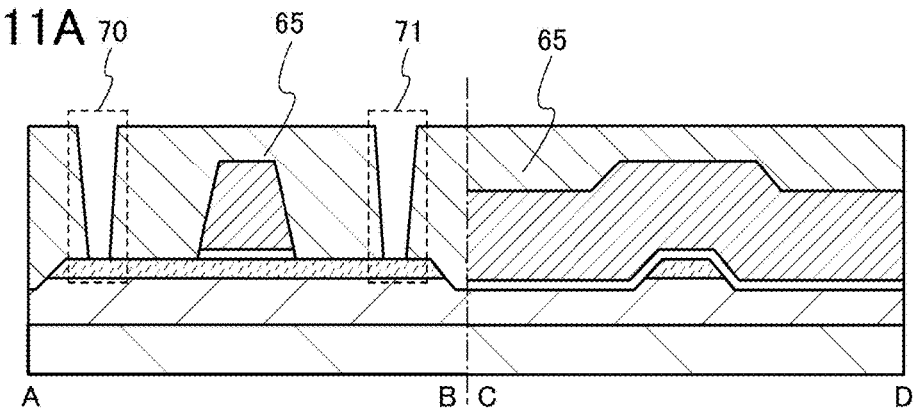
FIGS. 11A to 11C are cross-sectional views illustrating an example of a manufacturing process of a semiconductor device.

After the gate insulating film 57 is formed, an interlayer insulating film is formed and subjected to planarization treatment, and then openings 70 and 71 are formed in the planarized interlayer insulating film so as to reach the oxide semiconductor film 54 as illustrated in FIG. 11A, so that an interlayer insulating film 65 is formed. Examples of a method for forming the interlayer insulating film include a sputtering method, a CVD method, a vacuum evaporation method, and a pulsed laser deposition (PLD) method.

As the planarization treatment, chemical mechanical polishing (CMP) treatment, etching (dry etching or wet etching) treatment, and plasma treatment can be given, and they may be employed in combination. When the planarization treatment is combined with etching treatment, plasma treatment, or the like, the order of steps is not particularly limited and may be set as appropriate depending on the materials, the thickness, and the surface roughness of the interlayer insulating film. Alternatively, a large part of the interlayer insulating film may be removed by CMP treatment and the remaining part may be removed by dry etching treatment.

Note that the CMP treatment may be performed only once or more than once. When the CMP treatment is performed more than once, first polishing is preferably performed at a high polishing rate, followed by final polishing at a low polishing rate. By performing polishing steps at different polishing rates in combination, the planarity of the surface of the interlayer insulating film can be further improved.

Figure 11B:
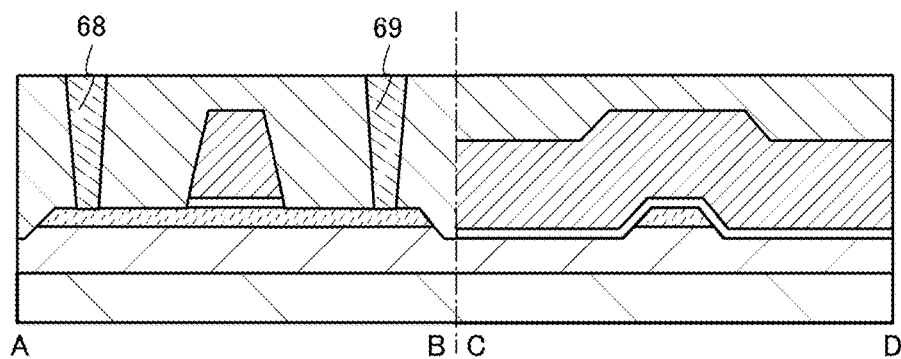

Then, a conductive film is formed so as to fill the openings 70 and 71 and planarization treatment is performed on the conductive film to expose a surface of the interlayer insulating film 65, so that the pair of conductive films 68 and 69 is formed as illustrated in FIG. 11B. The conductive film to be the pair of conductive films 68 and 69 can be formed using a method similar to that for the gate electrode 59 as appropriate.

As the planarization treatment, CMP treatment, etching (dry etching or wet etching) treatment, and plasma treatment can be given, and they may be employed in combination. When the planarization treatment is performed in combination with etching treatment, plasma treatment, or the like, the order of steps is not particularly limited and may be set as appropriate depending on the material, the thickness, and the surface roughness of the conductive film. Alternatively, a large part of the conductive film may be removed by CMP treatment and the remaining part may be removed by dry etching treatment.

Note that the CMP treatment may be performed only once or more than once. When the CMP treatment is performed more than once, first polishing is preferably performed at a high polishing rate, followed by final polishing at a low polishing rate. By performing polishing steps at different polishing rates in combination, the planarity of the surface of the conductive film can be further improved.

Figure 11C:
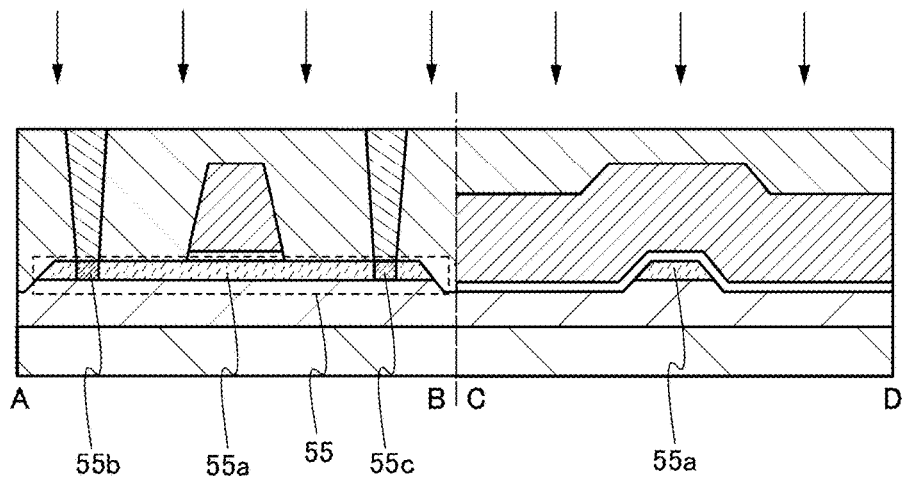

After the pair of conductive films 68 and 69 is formed, an impurity element is added to the oxide semiconductor film 54, so that the oxide semiconductor film 55 including the first region 55a and the second regions 55b and 55c is formed as illustrated in FIG. 11C.

Oxygen vacancies are generated in the second regions 55b and 55c because of physical damage caused when the pair of conductive films 68 and 69 is impacted by an ion doping method, an ion implantation method, a plasma immersion ion implantation method, or the like and the impact is transmitted to the oxide semiconductor film 55.

The oxygen vacancies and hydrogen in the oxide semiconductor film reduce the resistance of the second regions 55b and 55c, leading to reduction in contact resistance with the pair of conductive films 68 and 69.

Furthermore, an element contained in the pair of conductive films 68 and 69 might be mixed into the second regions 55b and 55c owing to the impact received by the conductive films 68 and 69.

The addition of the impurity element is controlled by appropriately setting the implantation conditions such as the acceleration voltage and the dosage, or the thickness of the insulating film 56 through which the impurity element passes. The acceleration voltage for addition of the impurity element is preferably higher than or equal to 5 kV and lower than or equal to 50 kV, more preferably higher than or equal to 10 kV and lower than or equal to 40 kV. For example, in the case where argon is added by an ion implantation method, the acceleration voltage is set to 10 kV and the dose is set to greater than or equal to $1 \times 10^{13}$ ions/cm' and less than or equal to $1 \times 10^{16}$ ions/cm$^2$, e.g., $1 \times 10^{14}$ ions/cm$^2$. In the case where a phosphorus ion is added by an ion implantation method, the acceleration voltage is set to 30 kV and the dose is set to greater than or equal to $1 \times 10^{13}$ ions/cm$^2$ and less than or equal to $5 \times 10^{16}$ ions/cm$^2$, e.g., $1 \times 10^{15}$ ions/cm$^2$.

After the oxide semiconductor film 55 is formed, wirings 72 and 73 electrically connected to the pair of conductive films 68 and 69 are formed as illustrated in FIG. 1B.

Note that the wirings 72 and 73 can be formed using a method similar to that for the gate electrode 59.

Through the above-described steps, the transistor can be manufactured.

Since the transistor described in this embodiment does not include a region where the gate electrode 59 overlaps with the pair of conductive films 68 and 69, the parasitic capacitance can be reduced and the on-state current is high. In addition, since a low-resistance region can be formed stably in the transistor described in this embodiment, the transistor has higher on-state current and smaller variations in electrical characteristics than a conventional transistor.

MODIFICATION EXAMPLE 1

Figure 13A:
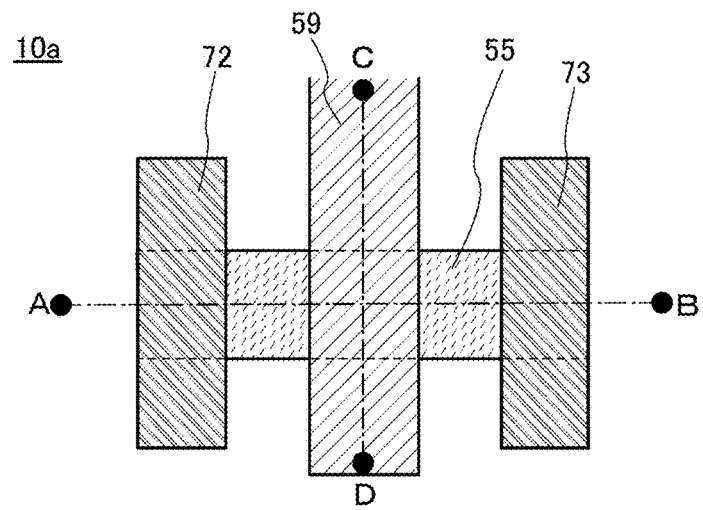
FIGS. 13A to 13C are a top view and cross-sectional views illustrating one embodiment of a semiconductor device.
Figure 13B:
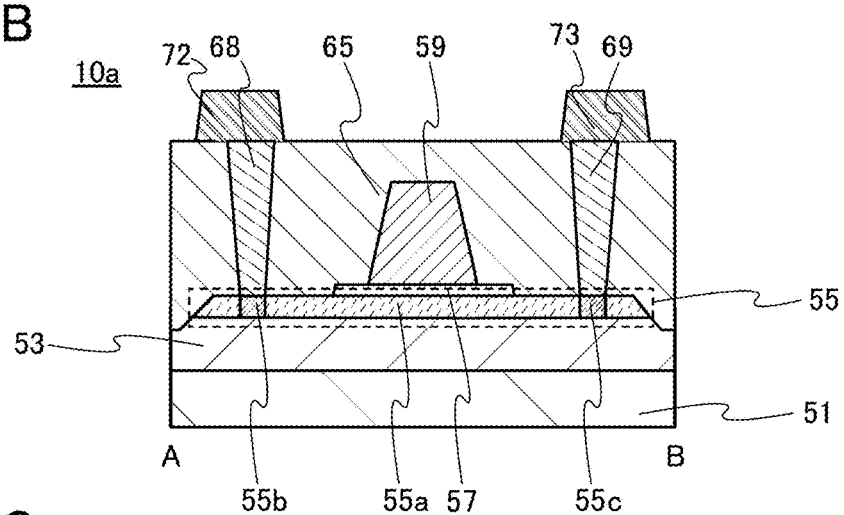
Figure 13C:
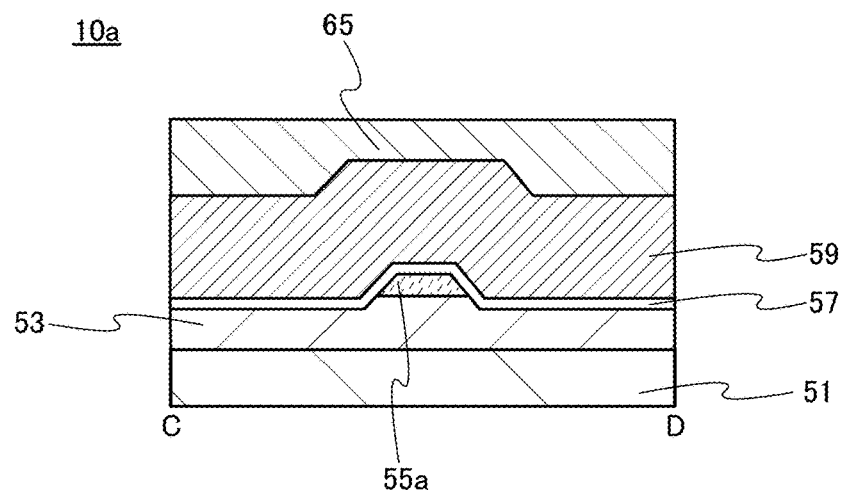

A modification example of the transistor described in this embodiment will be described with reference to FIGS. 13A to 13C. In a transistor 10a in FIGS. 13A to 13C, the edge of the gate insulating film 57 is located outside the edge of the gate electrode 59 as shown in the cross section along A-B. In other words, an end of the gate insulating film 57 extends beyond an end of the gate electrode 59.

MODIFICATION EXAMPLE 2

Figure 14A:
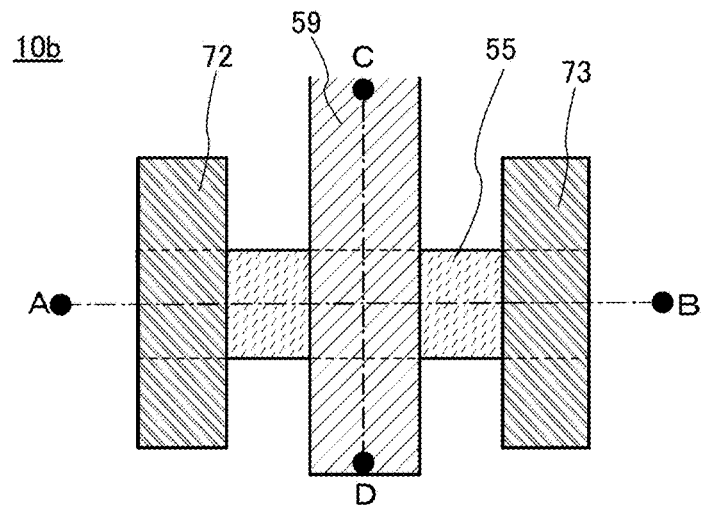
FIGS. 14A to 14C are a top view and cross-sectional views illustrating one embodiment of a semiconductor device.
Figure 14B:
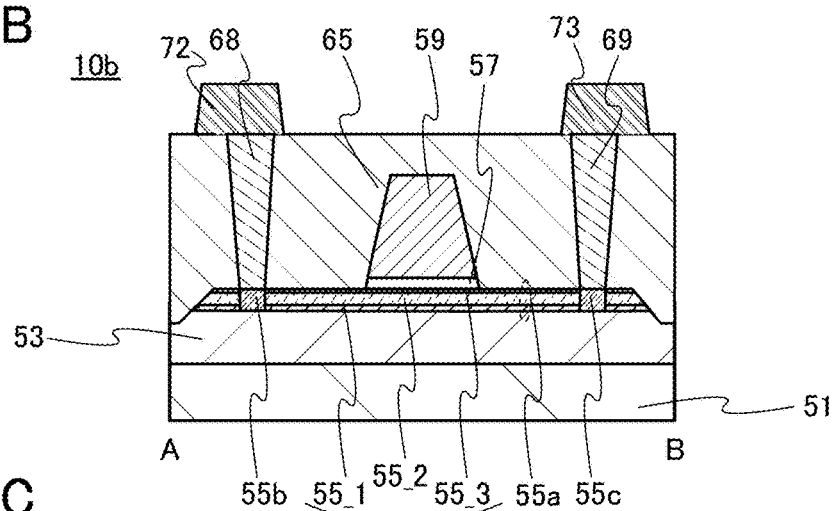
Figure 14C:
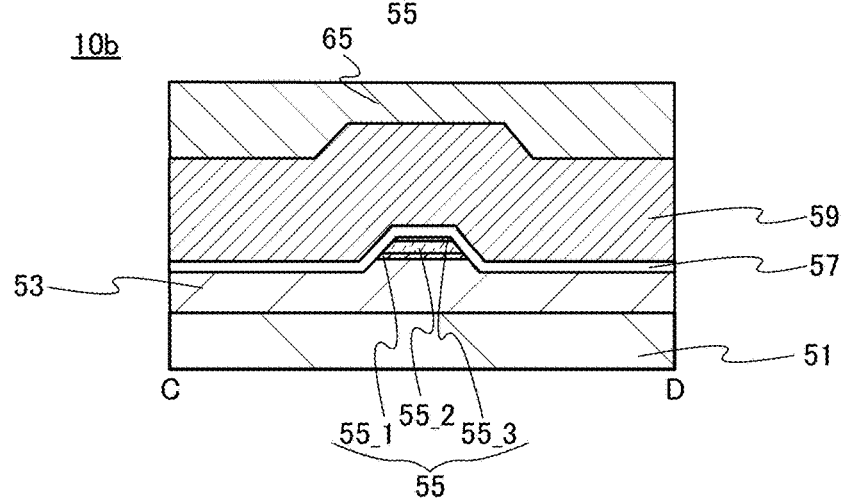

A transistor having a structure different from that of Modification Example 1 will be described with reference to FIGS. 14A to 14C. In a transistor 10b illustrated in FIGS. 14A to 14C, the oxide semiconductor film 55 includes an oxide semiconductor film 55_1, an oxide semiconductor film 55_2, and an oxide semiconductor film 55_3 that are stacked in this order from the insulating film 53 side.

For the oxide semiconductor film 55_2, an oxide semiconductor whose electron affinity (an energy difference between a vacuum level and the conduction band minimum) is higher than those of the oxide semiconductor film 55_1 and the oxide semiconductor film 55_3 is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor film 55_1 and the oxide semiconductor film 55_3 each contain one or more kinds of metal elements contained in the oxide semiconductor film 55_2. For example, the oxide semiconductor film 55_1 and the oxide semiconductor film 55_3 are preferably formed using an oxide semiconductor whose conduction band minimum is closer to a vacuum level than that of the oxide semiconductor film 55_2 by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 59, a channel is formed in the oxide semiconductor film 55_2 whose conduction band minimum is the lowest in the oxide semiconductor film 55. In other words, the oxide semiconductor film 55_3 is formed between the oxide semiconductor film 55_2 and the gate insulating film 57, whereby the channel of the transistor is formed in a region that is not in contact with the gate insulating film 57.

Further, since the oxide semiconductor film 55_1 contains one or more kinds of metal elements contained in the oxide semiconductor film 55_2, an interface state is unlikely to be formed at the interface between the oxide semiconductor film 55_2 and the oxide semiconductor film 55_1, compared with the interface between the oxide semiconductor film 55_2 and the insulating film 53 on the assumption that the oxide semiconductor film 55_2 is in contact with the insulating film 53. The interface state sometimes forms a channel; therefore, the threshold voltage of the transistor is changed in some cases. Thus, with the oxide semiconductor film 55_1, fluctuations in electrical characteristics of the transistor, such as a threshold voltage, can be reduced. Further, the reliability of the transistor can be improved.

Furthermore, since the oxide semiconductor film 55_3 contains one or more kinds of metal elements contained in the oxide semiconductor film 55_2, scattering of carriers is unlikely to occur at the interface between the oxide semiconductor film 55_2 and the oxide semiconductor film 55_3, compared with the interface between the oxide semiconductor film 55_2 and the gate insulating film 57 on the assumption that the oxide semiconductor film 55_2 is in contact with the gate insulating film 57. Thus, with the oxide semiconductor film 55_3, the field-effect mobility of the transistor can be increased.

For the oxide semiconductor film 55_1 and the oxide semiconductor film 55_3, for example, a material containing Al, Ti, Ga, Ge, Y, Zr, Sn, La, Ce, or Hf at a higher atomic ratio than that used for the oxide semiconductor film 55_2 can be used. Specifically, the atomic ratio of any of the above metal elements in the oxide semiconductor film 55_1 and the oxide semiconductor film 55_3 is 1.5 times or more, preferably 2 times or more, more preferably 3 times or more as much as that in the oxide semiconductor film 55_2. Any of the above metal elements is strongly bonded to oxygen and thus has a function of suppressing generation of oxygen vacancies in the oxide semiconductor film 55_1 and the oxide semiconductor film 55_3. That is, oxygen vacancies are less likely to be generated in the oxide semiconductor film 55_1 and the oxide semiconductor film 55_3 than in the oxide semiconductor film 55_2.

Note that when each of the oxide semiconductor film 55_1, the oxide semiconductor film 55_2, and the oxide semiconductor film 55_3 is an In-M-Zn oxide containing at least indium, zinc, and M (M is a metal such as Al, Ti, Ga, Ge, Y, Zr, Sn, La, Ce, or Hf), and when the oxide semiconductor film 55_1 has an atomic ratio of In to M and Zn which is $x_1:y_1:z_1$, the oxide semiconductor film 55_2 has an atomic ratio of In to M and Zn which is $x_2:y_2:z_2$, and the oxide semiconductor film 55_3 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$.

In the case where Zn and O are not taken into consideration, the proportion of In and the proportion of M in each of the oxide semiconductor film 55_1 and the oxide semiconductor film 55_3 are preferably less than 50 atomic % and greater than or equal to 50 atomic %, respectively, more preferably less than 25 atomic % and greater than or equal to 75 atomic %, respectively. In the case where Zn and O are not taken into consideration, the proportion of In and the proportion of M in the oxide semiconductor film 55_2 are preferably greater than or equal to 25 atomic % and less than 75 atomic %, respectively, more preferably greater than or equal to 34 atomic % and less than 66 atomic %, respectively.

The thickness of each of the oxide semiconductor film 55_1 and the oxide semiconductor film 55_3 is greater than or equal to 3 nm and less than or equal to 100 nm, preferably greater than or equal to 3 nm and less than or equal to 50 nm. The thickness of the oxide semiconductor film 55_2 is greater than or equal to 3 nm and less than or equal to 200 nm, preferably greater than or equal to 3 nm and less than or equal to 100 nm, more preferably greater than or equal to 3 nm and less than or equal to 50 nm. Furthermore, the oxide semiconductor film 55_2 is preferably thicker than the oxide semiconductor film 55_1 and the oxide semiconductor film 55_3.

For each of the oxide semiconductor film 55_1, the oxide semiconductor film 55_2, and the oxide semiconductor film 55_3, an oxide semiconductor containing indium, zinc, and gallium can be used, for example. Note that the oxide semiconductor film 55_2 preferably contains indium because carrier mobility can be increased.

Note that as the gate insulating film of the transistor, an insulating film containing silicon is used in many cases; thus, it is preferred that, as in the transistor of one embodiment of the present invention, a region of the multilayer film, which serves as a channel, not be in contact with the gate insulating film as in the transistor of one embodiment of the present invention for the above-described reason. In the case where a channel is formed at the interface between the gate insulating film and the multilayer film, scattering of carriers occurs at the interface, whereby the field-effect mobility of the transistor is reduced in some cases. Also from the view of the above, it is preferred that the region of the multilayer film, which serves as a channel, be apart from the gate insulating film.

For this reason, the layered structure of the oxide semiconductor film 55_1, the oxide semiconductor film 55_2, and the oxide semiconductor film 55_3 in the oxide semiconductor film 55 enables formation of a channel in the oxide semiconductor film 55_2, so that a transistor having high field effect mobility and stable electric characteristics can be obtained.

Next, band diagrams of the oxide semiconductor film 55 will be described. In the stack corresponding to the oxide semiconductor film 55, an In—Ga—Zn oxide with an energy gap of 3.5 eV is used for layers corresponding to the oxide semiconductor film 55_1 and the oxide semiconductor film 55_3, and an In—Ga—Zn oxide with an energy gap of 3.15 eV is used for a layer corresponding to the oxide semiconductor film 55_2.

The energy gaps of the oxide semiconductor film 55_1, the oxide semiconductor film 55_2, and the oxide semiconductor film 55_3 were measured with the use of a spectroscopic ellipsometer (UT-300 manufactured by HORIBA Jobin Yvon) under the condition where the thickness of each of the film was set to 10 nm. The energy difference between the vacuum level and the valence band maximum was measured using an ultraviolet photoelectron spectroscopy (UPS) device (VersaProbe, ULVAC-PHI, Inc.).

Figure 15A:
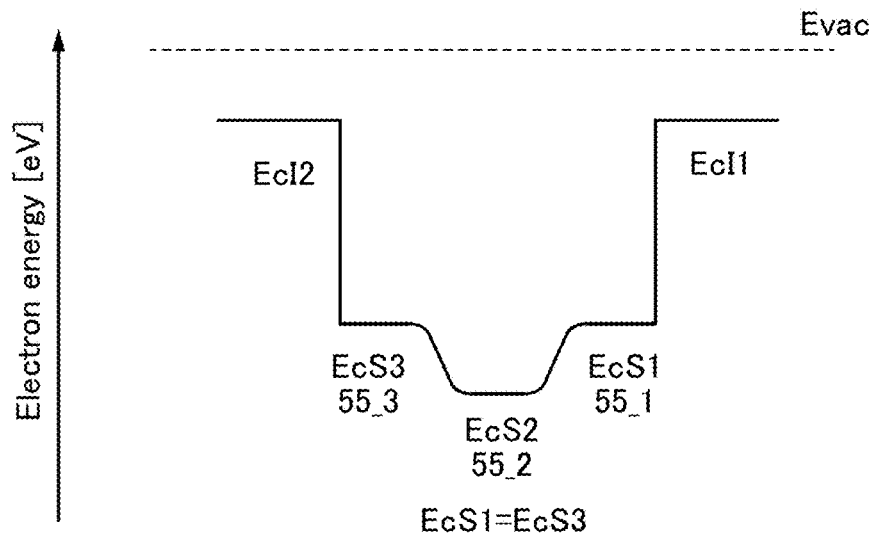
FIGS. 15A and 15B are band diagrams.

FIG. 15A schematically shows part of a band diagram of an energy gap (electron affinity) between the vacuum level and the conduction band minimum of each layer, which is calculated by subtracting the energy gap of each layer from the energy gap between the vacuum level and the valence band maximum. FIG. 15A is a band diagram showing the case where silicon oxide films are provided in contact with the oxide semiconductor film 55_1 and the oxide semiconductor film 55_3. Here, Evac represents energy of the vacuum level, EcI1 and EcI2 each represent energy at the conduction band minimum of the silicon oxide film, EcS1 represents energy at the conduction band minimum of the oxide semiconductor film 55_1, EcS2 represents energy at the conduction band minimum of the oxide semiconductor film 55_2, and EcS3 represents energy at the conduction band minimum of the oxide semiconductor film 55_3.

As shown in FIG. 15A, the energies at the conduction band minimums of the oxide semiconductor film 55_1, the oxide semiconductor film 55_2, and the oxide semiconductor film 55_3 are continuously changed. This can be understood also from the fact that the constituent elements are common to the oxide semiconductor film 55_1, the oxide semiconductor film 55_2, and the oxide semiconductor film 55_3 and oxygen is easily diffused among the oxide semiconductor films 55_1 to 55_3. Thus, the oxide semiconductor film 55_1, the oxide semiconductor film 55_2, and the oxide semiconductor film 55_3 have a continuous physical property although they have different compositions and form a stack.

The oxide semiconductor film 55 in which layers containing the same main components are stacked is formed to have not only a simple layered structure of the layers but also a continuous energy band (here, in particular, a well structure having a U shape in which the energy of the conduction band minimum is continuously changed between the layers). In other words, the layered structure is formed such that there exists no impurity that forms a defect state such as a trap center or a recombination center at each interface. If impurities exist between the stacked layers in the multilayer film, the continuity of the energy band is lost and carriers disappear by a trap or recombination.

Note that FIG. 15A shows the case where EcS1 and EcS3 are similar to each other; however, EcS1 and EcS3 may be different from each other. For example, part of the band structure in the case where EcS1 is higher than EcS3 is shown as in FIG. 15B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor film 55_1 and the oxide semiconductor film 55_3 and an In—Ga—Zn oxide whose atomic ratio of In to Ga and Zn is 1:1:1 or 3:1:2 can be used for the oxide semiconductor film 55_2. Further, when EcS1 is higher than EcS3, an In—Ga—Zn oxide whose atomic ratio of In to Ga and Zn is 1:6:4 or 1:9:6 can be used for the oxide semiconductor film 55_1, an In—Ga—Zn oxide whose atomic ratio of In to Ga and Zn is 1:1:1 or 3:1:2 can be used for the oxide semiconductor film 55_2, and an In—Ga—Zn oxide whose atomic ratio of In to Ga and Zn is 1:3:2, 1:3:3, or 1:3:4 can be used for the oxide semiconductor film 55_3, for example.

Figure 15B:
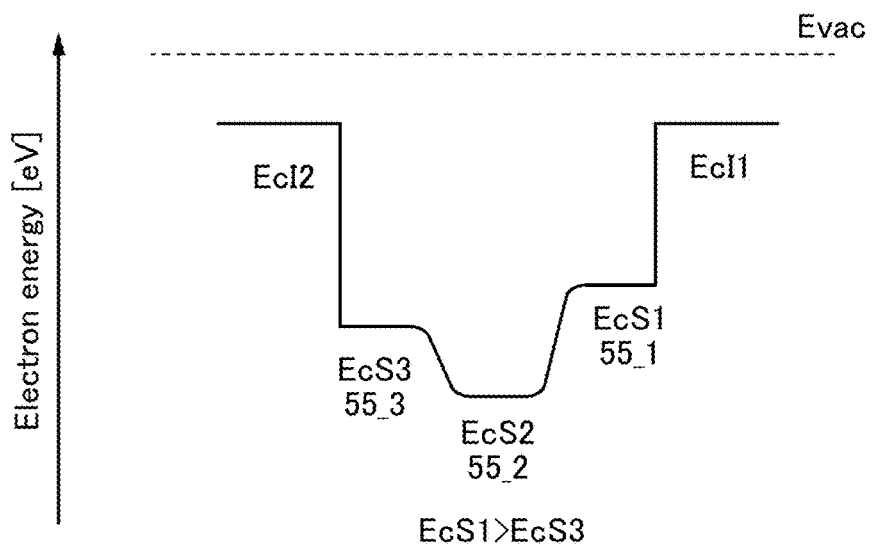

According to FIGS. 15A and 15B, the oxide semiconductor film 55_2 in the oxide semiconductor film 55 serves as a well, so that a channel is formed in the oxide semiconductor film 55_2 in a transistor including the oxide semiconductor film 55. Since the energy of the conduction band minimum is continuously changed, the oxide semiconductor film 55 can also be referred to as a U-shaped well. Furthermore, a channel formed to have such a structure can also be referred to as a buried channel.

Note that trap states resulting from impurities or defects can be formed in the vicinity of the interfaces between the oxide semiconductor film 55_1 and an insulating film such as the silicon oxide film and between the oxide semiconductor film 55_3 and such an insulating film. The oxide semiconductor film 55_2 can be apart from the trap state owing to the existence of the oxide semiconductor film 55_1 and the oxide semiconductor film 55_3. When the energy difference between EcS1 or EcS3 and EcS2 is small, however, an electron in the oxide semiconductor film 55_2 might reach the trap state by passing over the energy difference. When the electron is trapped by the trap state, negative fixed charge is generated at the interface with the insulating film, whereby the threshold voltage of the transistor shifts in the positive direction Thus, to reduce a change in the threshold voltage of the transistor, energy differences between EcS2 and each of EcS1 and EcS3 are necessary. Each of the energy differences is preferably greater than or equal to 0.1 eV, more preferably greater than or equal to 0.15 eV.

The oxide semiconductor film 55_1, the oxide semiconductor film 55_2, and the oxide semiconductor film 55_3 preferably include crystal parts. In particular, when crystals with c-axis alignment are used, the transistor can have stable electrical characteristics.

In the case where an In—Ga—Zn oxide is used for the oxide semiconductor film 55, it is preferred that the oxide semiconductor film 55_3 contain less In than the oxide semiconductor film 55_2 so that diffusion of In into the gate insulating film is prevented.

MODIFICATION EXAMPLE 3

Figure 16A:
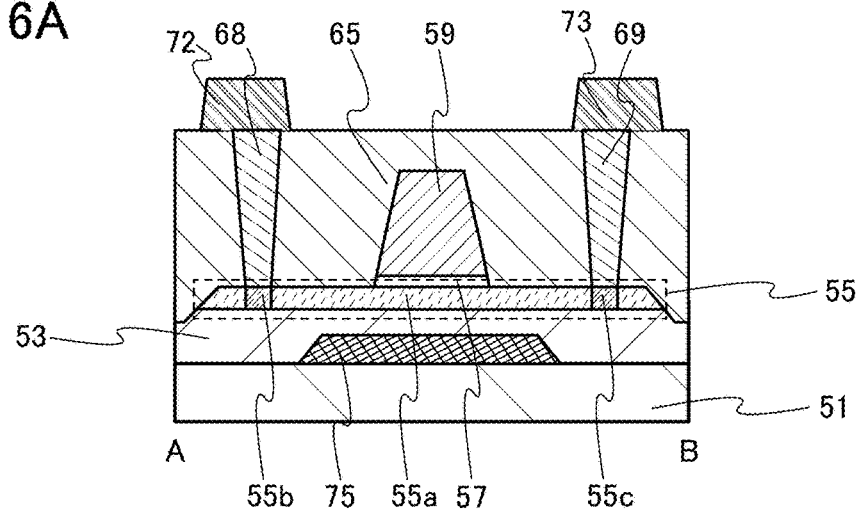
FIGS. 16A to 16C are cross-sectional views illustrating an example of a manufacturing process of a semiconductor device.
Figure 16B:
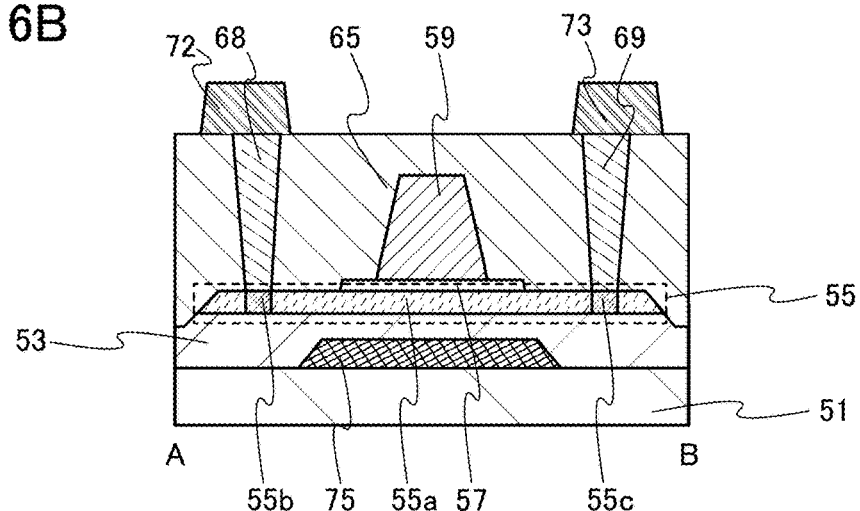
Figure 16C:
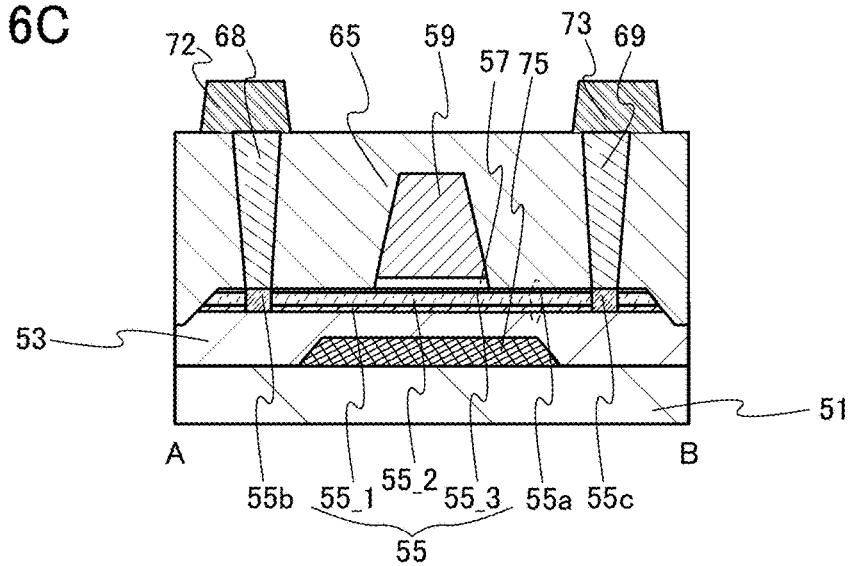

Transistors having structures different from those of Modification Examples 1 and 2 will be described with reference to FIGS. 16A to 16C. The transistor in FIG. 16A is different from that in FIG. 1B in including a gate electrode 75 functioning as a back gate. The transistor in FIG. 16B is different from that in FIG. 12B in that the gate electrode 75 functioning as a back gate is provided. The transistor in FIG. 16C is different from that in FIG. 13B in that the gate electrode 75 functioning as a back gate is provided.

Providing the gate electrode 75 functioning as a back gate allows further increase in the on-state current and control of the threshold voltage. In order to increase the on-state current, for example, the gate electrode 59 and the gate electrode 75 are electrically connected to each other to have the same potential, and the transistor is driven as a dual-gate transistor. To control the threshold voltage, the gate electrode 59 and the gate electrode 75 are not electrically connected to each other so that a fixed potential different from the potential of the gate electrode 59 is supplied to the gate electrode 75.

In this embodiment, one embodiment of the present invention has been described. Other embodiments of the present invention will be described in the other embodiments. Note that one embodiment of the present invention is not limited to the above. Although an example where the resistance of the second regions 55b and 55c and the like is reduced by performing ion doping or ion implantation on the pair of conductive films 68 and 69 is described as one embodiment of the present invention, one embodiment of the present invention is not limited thereto. Depending on the cases or circumstances, the resistance of the second regions 55b and 55c and the like may be reduced by another method in one embodiment of the present invention.

The structures, the methods, and the like described in this embodiment can be combined as appropriate with any of the structures, the methods, and the like described in the other embodiments.

(Embodiment 2)

In this embodiment, a semiconductor device having a structure different from that of the semiconductor device in Embodiment 1 will be described with reference to drawings.

Figure 17A:
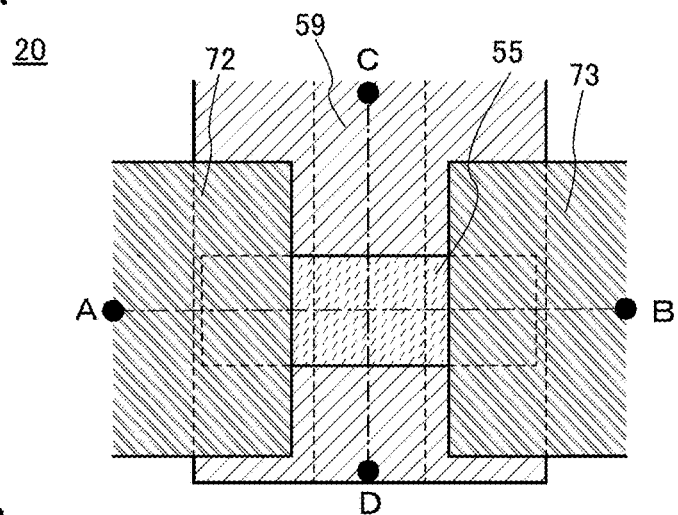
FIGS. 17A to 17C are a top view and cross-sectional views illustrating one embodiment of a semiconductor device.
Figure 17B:
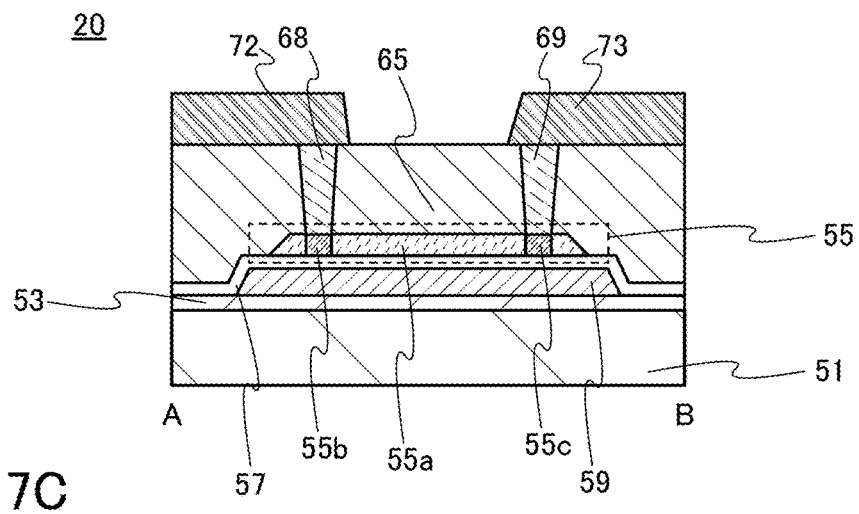
Figure 17C:
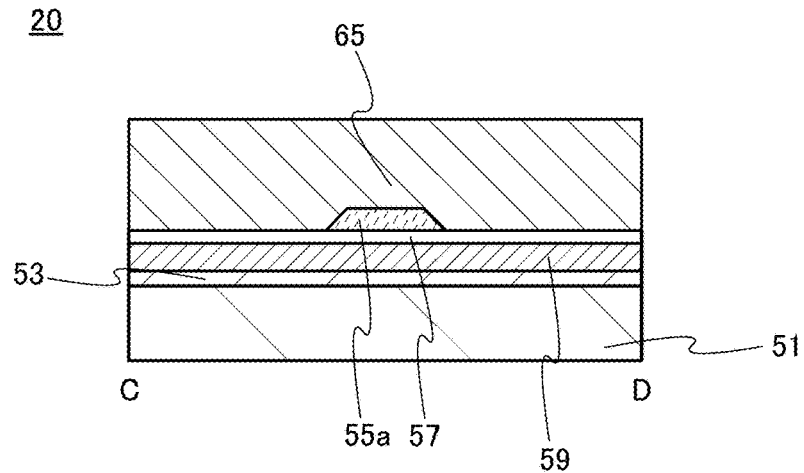

FIGS. 17A to 17C illustrate bottom-gate self-aligned transistors that are examples of a transistor in the semiconductor device. FIG. 17A is a top view of a transistor. FIG. 17B is a cross-sectional view along dashed-dotted line A-B in FIG. 17A. FIG. 17C is a cross-sectional view along dashed-dotted line C-D in FIG. 17A. Note that for simplification of the drawing, some components in the top view in FIG. 17A are not illustrated. In some cases, the direction of the dashed-dotted line A-B is referred to as the channel length direction, and the direction of the dashed-dotted line C-D is referred to as the channel width direction.

A transistor 20 illustrated in FIGS. 17A to 17C includes the substrate 51; the insulating film 53 over the substrate 51; the gate electrode 59 over the insulating film 53; the gate insulating film 57 over the insulating film 53 and the gate electrode 59; the oxide semiconductor film 55 that is in contact with the gate insulating film 57 and includes the first region 55a and the second regions 55b and 55c; the interlayer insulating film 65 over the oxide semiconductor film 55 and the gate insulating film 57; and the pair of conductive films 68 and 69 that is in contact with the second regions 55b and 55c in the oxide semiconductor film 55 through openings in the interlayer insulating film 65.

Furthermore, the wirings 72 and 73 electrically connected to the pair of conductive films 68 and 69 may be provided in the transistor.

Oxygen vacancies are generated in the second regions 55b and 55c because of physical damage caused when the conductive films 68 and 69 are impacted by an ion doping method, an ion implantation method, a plasma immersion ion implantation method, or the like and the impact is transmitted to the oxide semiconductor film 55.

The oxygen vacancies and hydrogen in the oxide semiconductor film reduce the resistance of the second regions 55b and 55c, leading to reduction in contact resistance with the pair of conductive films 68 and 69.

Furthermore, an element contained in the pair of conductive films 68 and 69 might be mixed into the second regions 55b and 55c owing to the impact received by the conductive films 68 and 69.

Note that in adding an impurity to the pair of conductive films 68 and 69 by an ion doping method, an ion implantation method, a plasma immersion ion implantation method, or the like, controlling an acceleration voltage is important. When the acceleration voltage is too high, ions are also added to the first region; thus, the acceleration voltage needs to be appropriately adjusted in accordance with the thicknesses and materials of the interlayer insulating film 65 and the pair of conductive films 68 and 69. Furthermore, it is preferred that ions be more easily implanted into the conductive films 68 and 69 than into the interlayer insulating film 65. For example, the conductive films 68 and 69 are preferably formed using a material that easily causes channeling. Channeling is a phenomenon in which an ion beam is introduced deeply from the direction in which atoms are sparse by utilizing atomic densities that vary among the directions of crystals. When such a material is used, for example, ions can be implanted into a film with a columnar structure more deeply even at the same acceleration voltage. Note that ions may be implanted into the first region and the second regions.

Note that the description in Embodiment 1 can be referred to for the details of the components illustrated in FIGS. 17A to 17C.

Next, a method for manufacturing the transistor illustrated in FIGS. 17A to 17C will be described with reference to FIGS. 18A to 18C and FIGS. 19A to 19C.

Figure 18A:
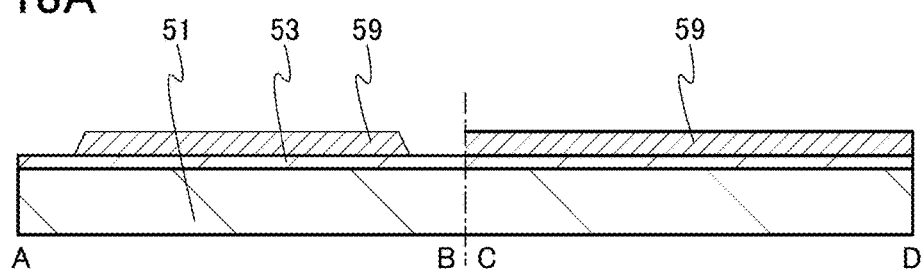
FIGS. 18A to 18C are cross-sectional views illustrating an example of a manufacturing process of a semiconductor device.

As illustrated in FIG. 18A, the insulating film 53 and the gate electrode 59 are formed over the substrate 51. The description in Embodiment 1 can be referred to for materials and forming methods of the insulating film 53 and the gate electrode 59.

Figure 18B:
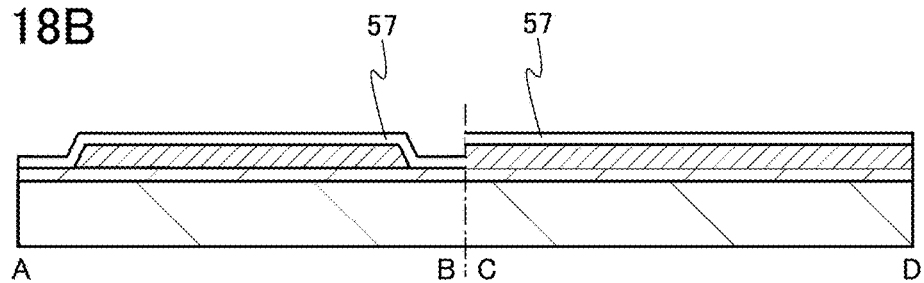

Next, the gate insulating film 57 is formed as illustrated in FIG. 18B after the formation of the gate electrode 59. The description in Embodiment 1 can be referred to for the material and forming method of the gate insulating film 57.

Figure 18C:
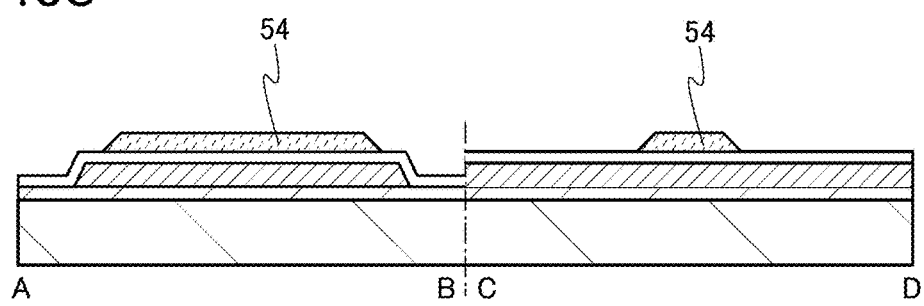

Next, the oxide semiconductor film 54 is formed as illustrated in FIG. 18C after the formation of the gate insulating film 57. The description in Embodiment 1 can be referred to for the material and forming method of the oxide semiconductor film 54.

Figure 19A:
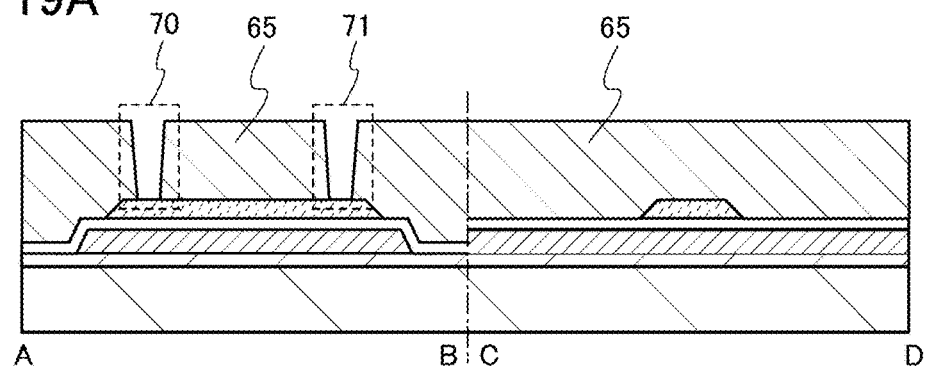
FIGS. 19A to 19C are cross-sectional views illustrating an example of a manufacturing process of a semiconductor device.

After the oxide semiconductor film 54 is formed, an interlayer insulating film is formed and subjected to planarization treatment, and then the openings 70 and 71 are formed in the planarized interlayer insulating film so as to reach the oxide semiconductor film 54 as illustrated in FIG. 19A, so that the interlayer insulating film 65 is formed. The description in Embodiment 1 can be referred to for the material and forming method of the interlayer insulating film.

Figure 19B:
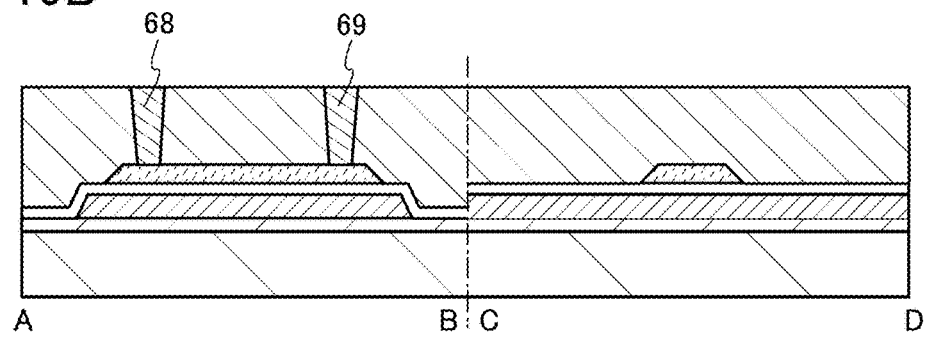

Then, a conductive film is formed so as to fill the openings 70 and 71 and planarization treatment is performed on the conductive film to expose a surface of the interlayer insulating film 65, so that the pair of conductive films 68 and 69 is formed as illustrated in FIG. 19B. The description in Embodiment 1 can be referred to for the material and forming method of the conductive film.

Figure 19C:
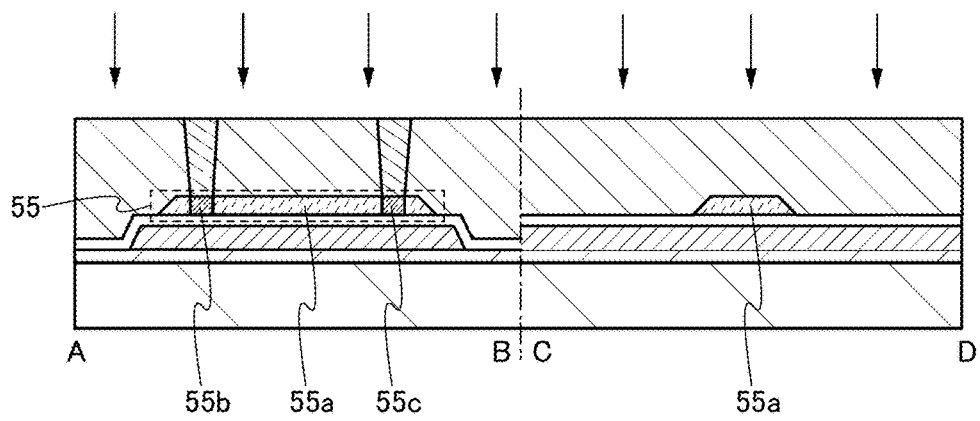

After the pair of conductive films 68 and 69 is formed, an impurity element is added to the oxide semiconductor film 54, so that the oxide semiconductor film 55 including the first region 55a and the second regions 55b and 55c is formed as illustrated in FIG. 19C.

Oxygen vacancies are generated in the second regions 55b and 55c because of physical damage caused when the pair of conductive films 68 and 69 is impacted by an ion doping method or an ion implantation method and the impact is transmitted to the oxide semiconductor film 55.

The oxygen vacancies and hydrogen in the oxide semiconductor film reduce the resistance of the second regions 55b and 55c, leading to reduction in contact resistance with the pair of conductive films 68 and 69.

Furthermore, an element contained in the pair of conductive films 68 and 69 might be mixed into the second regions 55b and 55c owing to the impact received by the conductive films 68 and 69.

The addition of the impurity element is controlled by appropriately setting the implantation conditions such as the acceleration voltage and the dosage, or the thicknesses and materials of the interlayer insulating film 65 and the pair of conductive films 68 and 69.

After the oxide semiconductor film 55 is formed, the wirings 72 and 73 electrically connected to the pair of conductive films 68 and 69 are formed as illustrated in FIG. 17B.

Note that the wirings 72 and 73 can be formed using a method similar to that for the gate electrode 59.

Through the above steps, the transistor can be manufactured.

MODIFICATION EXAMPLE 1

Figure 20A:
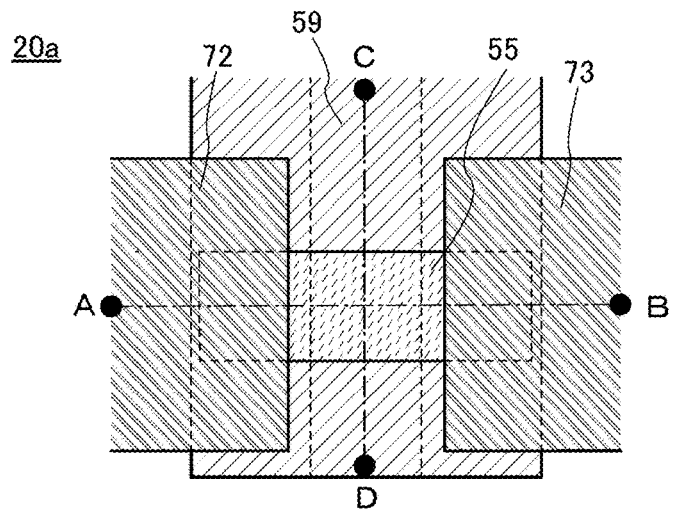
FIGS. 20A to 20C are a top view and cross-sectional views illustrating one embodiment of a semiconductor device.
Figure 20B:
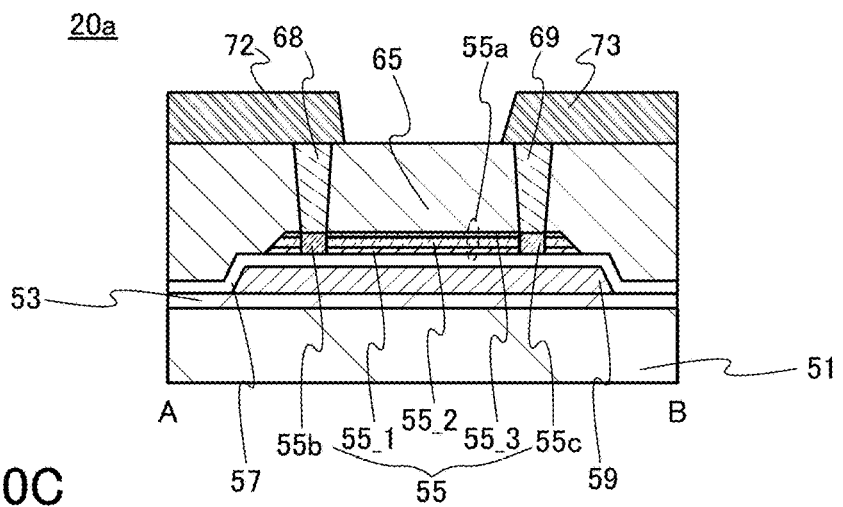
Figure 20C:
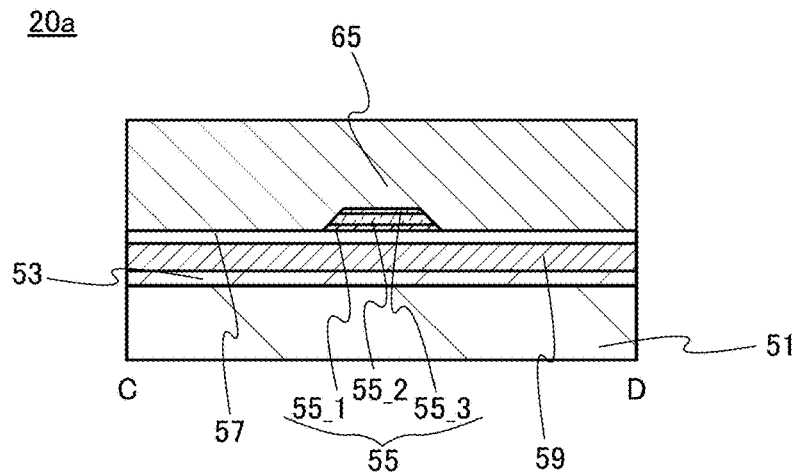

Here, a modification example of the transistor described in this embodiment will be described with reference to FIGS. 20A to 20C. In a transistor 20a in FIGS. 20A to 20C, the oxide semiconductor film 55 includes the oxide semiconductor film 55_1, the oxide semiconductor film 55_2, and the oxide semiconductor film 55_3 that are stacked in this order from the insulating film 53 side.

Such a structure enables formation of a channel in the oxide semiconductor film 55_2, so that a transistor having high field effect mobility and stable electric characteristics can be obtained, as described in Embodiment 1.

MODIFICATION EXAMPLE 2

Figure 21:
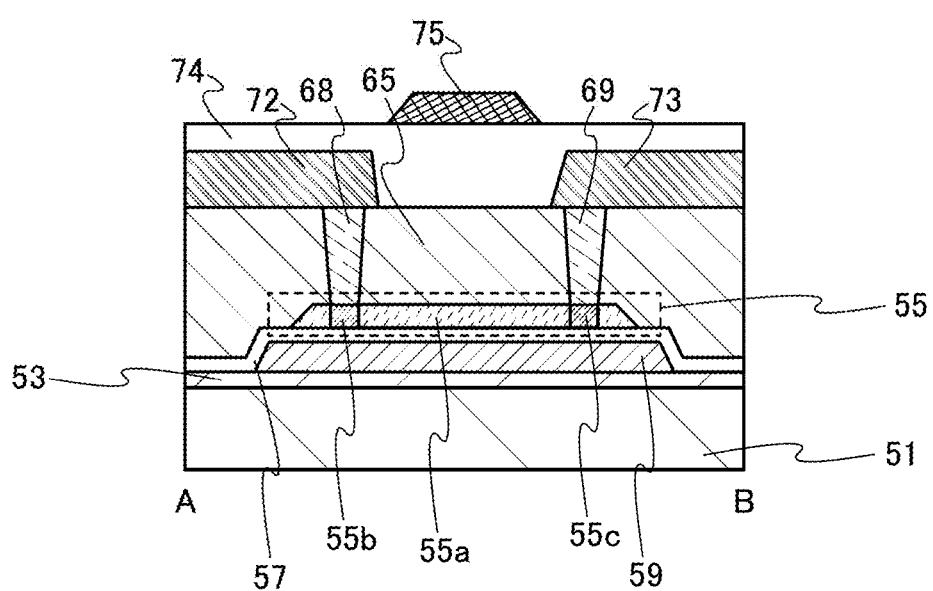
FIG. 21 is a cross-sectional view of an example of a manufacturing process of a semiconductor device.

Here, a transistor having a structure different from that in Modification Example 1 will be described with reference to FIG. 21. The transistor in FIG. 21 is different from that in FIG. 17B in that the interlayer insulating film 74 is provided after formation of the wirings 72 and 73 and the interlayer insulating film 65 and in that the gate electrode 75 functioning as a back gate is provided over the interlayer insulating film 74.

Providing the gate electrode 75 functioning as a back gate allows further increase in the on-state current and control of the threshold voltage. In order to increase the on-state current, for example, the gate electrode 59 and the gate electrode 75 are electrically connected to each other to have the same potential, and the transistor is driven as a dual-gate transistor. To control the threshold voltage, the gate electrode 59 and the gate electrode 75 are not electrically connected to each other so that a fixed potential different from the potential of the gate electrode 59 is supplied to the gate electrode 75.

MODIFICATION EXAMPLE 3

Figure 22A:
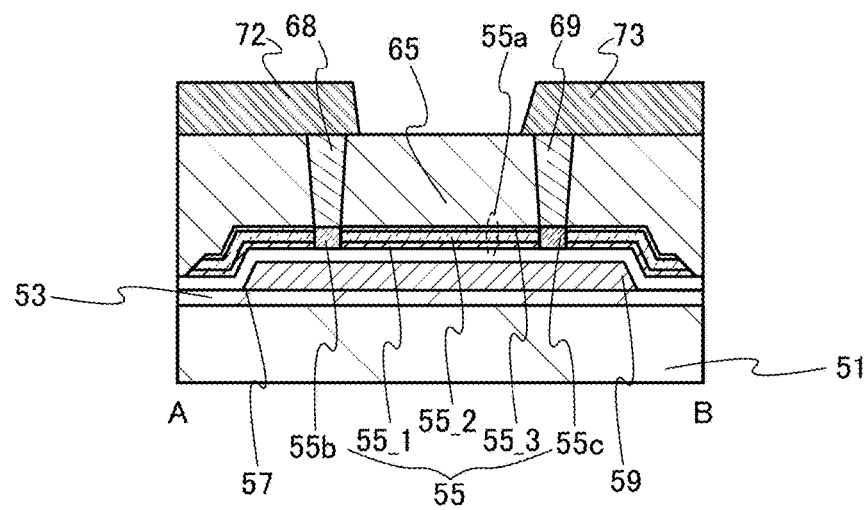
FIGS. 22A and 22B are cross-sectional views illustrating an example of a manufacturing process of a semiconductor device.
Figure 22B:
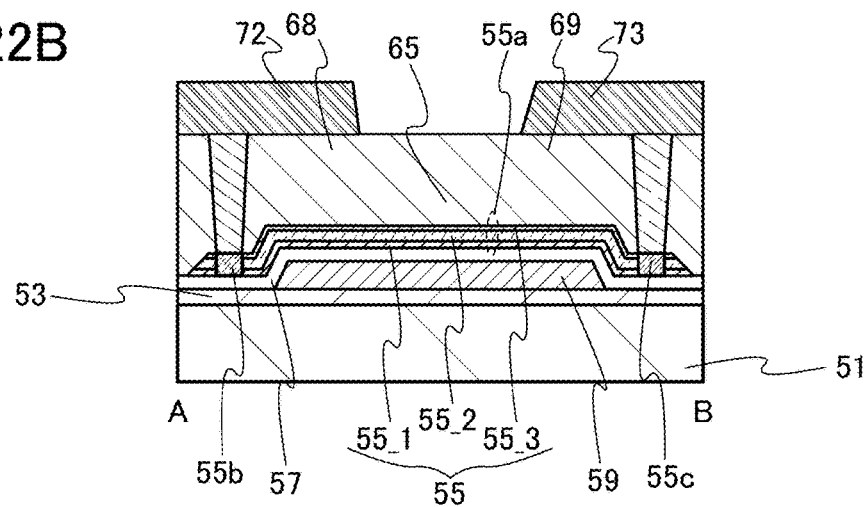

Here, transistors having structures different from those in Modification Examples 1 and 2 will be described with reference to FIGS. 22A and 22B. The transistor in FIG. 22A has a structure in which the oxide semiconductor film 55 is longer than the gate electrode 59 in the channel length direction. The transistor in FIG. 22B has a structure in which the oxide semiconductor film 55 is longer than the gate electrode 59 in the channel length direction and the second regions 55b and 55c do not overlap with the gate electrode 59.

The structures, the methods, and the like described in this embodiment can be combined as appropriate with any of the structures, the methods, and the like described in the other embodiments.

(Embodiment 3)

In this embodiment, a structural example of a semiconductor device including the transistor of one embodiment of the present invention will be described with reference to drawings.

[Cross-sectional Structure]

Figure 23A:
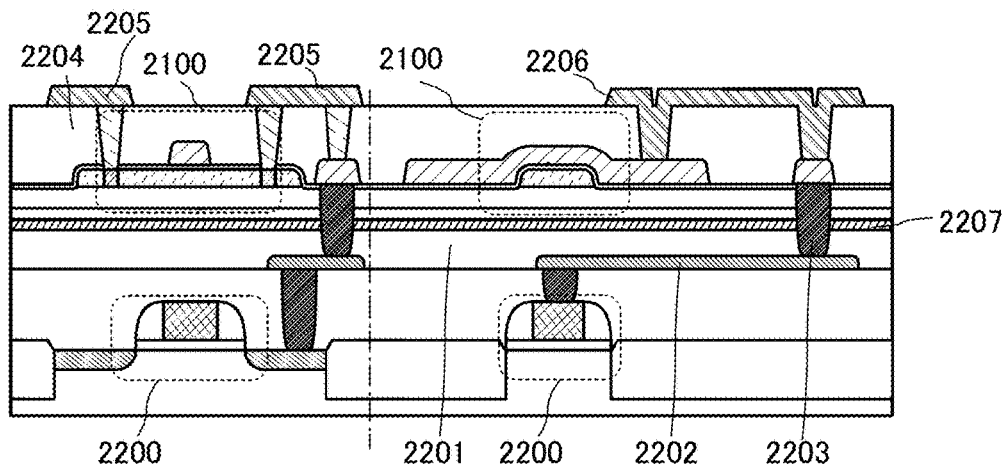
FIGS. 23A to 23D are cross-sectional views and circuit diagram illustrating structural examples of semiconductor devices.

FIG. 23A is a cross-sectional view of a semiconductor device of one embodiment of the present invention. The semiconductor device illustrated in FIG. 23A includes a transistor 2200 containing a first semiconductor material in a lower portion and a transistor 2100 containing a second semiconductor material in an upper portion. As the transistor 2100, any of the transistors described in the above embodiments can be used, and in FIG. 23A, an example in which the transistor 10 in the above embodiment is used as the transistor 2100 is shown. A cross-sectional view of the transistors in the channel length direction is on the left side of a dashed-dotted line, and a cross-sectional view of the transistors in the channel width direction is on the right side of the dashed-dotted line.

Note that the transistor 2100 may be provided with a back gate.

The first and second semiconductor materials preferably have different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor including an oxide semiconductor has a low off-state current.

The transistor 2200 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention that includes an oxide semiconductor.

FIG. 23A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An interlayer insulating film 2204 covering the transistor 2100, a pair of conductive films in contact with the oxide semiconductor film through an opening in the interlayer insulating film 2204, and wirings 2205 and 2206 electrically connected to the pair of conductive films and the gate electrode are provided.

Since the two kinds of transistors are stacked, the area occupied by the circuit can be reduced, allowing a plurality of circuits to be arranged at high density Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 formed using an oxide semiconductor is provided over the transistor 2200 formed using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 can also be improved.

The insulating film 2207 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing entry of hydrogen may be formed over the transistor 2100 to cover the transistor 2100 including an oxide semiconductor film. For the blocking film, a material that is similar to that of the insulating film 2207 can be used, and in particular, aluminum oxide is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 and entry of water and hydrogen into the oxide semiconductor film can be prevented.

Note that the transistor 2200 can be any of transistors of various types without being limited to a planar type transistor. For example, the transistor 2200 can be a fin-type transistor, a tri-gate transistor, or the like. An example of a cross-sectional view in such a case is shown in FIG. 23D. An insulating film 2212 is provided over a semiconductor substrate 2211. The semiconductor substrate 2211 has a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Although the gate electrode 2213 has a two-layer structure in this embodiment, the present invention is not limited to this example, and the gate electrode 2213 may have a single-layer structure or a multilayer structure including three or more layers. Source and drain regions 2215 are formed in the semiconductor substrate 2211. Note that here is shown an example in which the semiconductor substrate 2211 has the projecting portion; however, the semiconductor device of one embodiment of the present invention is not limited thereto. For example, a semiconductor region having a projecting portion may be formed by processing an SOI substrate.

[Circuit Configuration Example]

In the above structure, electrodes of the transistors 2100 and 2200 can be connected in a variety of ways; thus, a variety of circuits can be configured. Examples of circuit configurations that can be achieved by using the semiconductor device of one embodiment of the present invention will be described below.

Figure 23B:
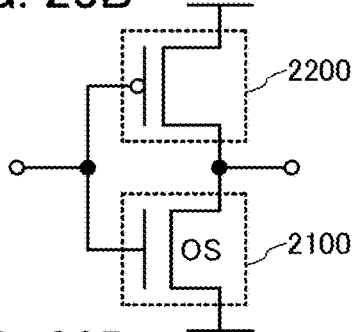

A circuit diagram in FIG. 23B shows a configuration of what is called a CMOS circuit in which the p-channel transistor 2200 and the n-channel transistor 2100 are connected to each other in series and in which gates of them are connected to each other.

Figure 23C:
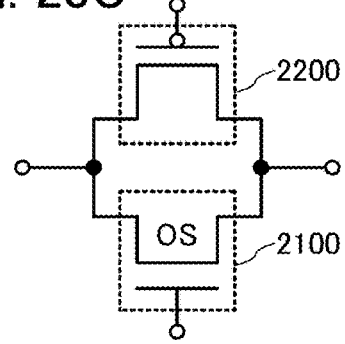
Figure 23D:
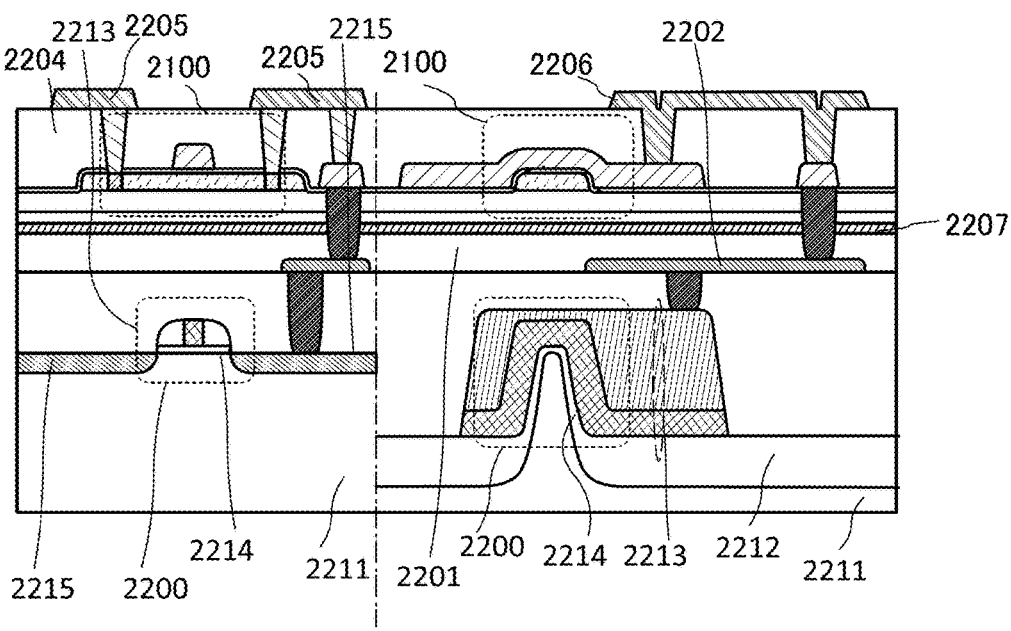

A circuit diagram in FIG. 23C shows a configuration in which sources of the transistors 2100 and 2200 are connected to each other and drains of the transistors 2100 and 2200 are connected to each other. With such a configuration, the transistors can function as what is called an analog switch.

Figure 24:
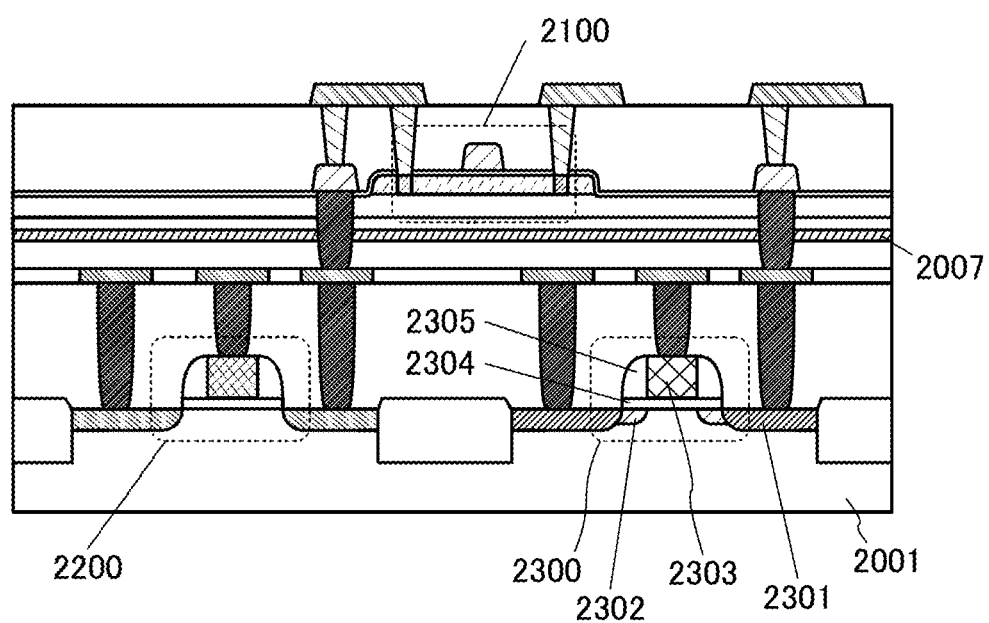
FIG. 24 is a cross-sectional view of a structural example of a semiconductor device.

FIG. 24 is a cross-sectional view of a semiconductor device in which a CMOS circuit includes a transistor 2200 and a transistor 2300 each having a channel formed using a first semiconductor material.

The transistor 2300 includes impurity regions 2301 serving as a source region or a drain region, a gate electrode 2303, a gate insulating film 2304, and a sidewall insulating film 2305. The transistor 2300 may also include an impurity region 2302 serving as an LDD region under the sidewall insulating film 2305. The description for FIG. 23A can be referred to for the other components in FIG. 24.

The polarities of the transistor 2200 and the transistor 2300 are preferably different from each other. For example, when the transistor 2200 is a p-channel transistor, the transistor 2300 is preferably an n-channel transistor.

A photoelectric conversion element such as a photodiode may be provided in the semiconductor devices illustrated in FIG. 23A and FIG. 24.

The photodiode may be formed using a single crystal semiconductor or a polycrystalline semiconductor. A photodiode using a single crystal semiconductor or a polycrystalline semiconductor is preferred because of its high light detection sensitivity.

Figure 25A:
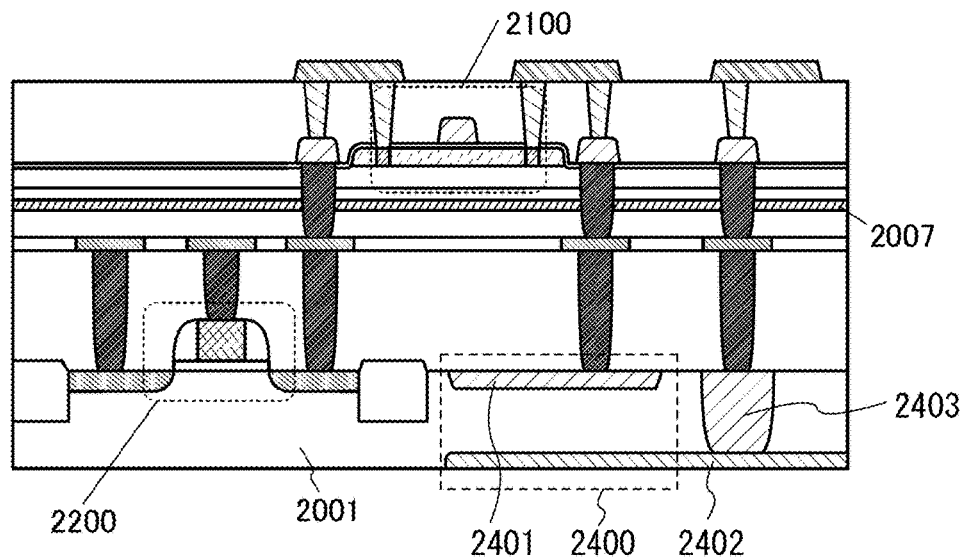
FIGS. 25A and 25B are cross-sectional views illustrating structural examples of semiconductor devices.

FIG. 25A is a cross-sectional view of a semiconductor device where a substrate 2001 is provided with a photodiode 2400. The photodiode 2400 includes a conductive film 2401 having a function as one of an anode and a cathode, a conductive film 2402 having a function as the other of the anode and the cathode, and a conductive film 2403 electrically connecting the conductive film 2402 and a plug 2007. The conductive films 2401 to 2403 may be formed by injecting an impurity in the substrate 2001.

Although the photodiode 2400 is provided so that a current flows in the vertical direction with respect to the substrate 2001 in FIG. 25A, the photodiode 2400 may be provided so that a current flows in the lateral direction with respect to the substrate 2001.

Figure 25B:
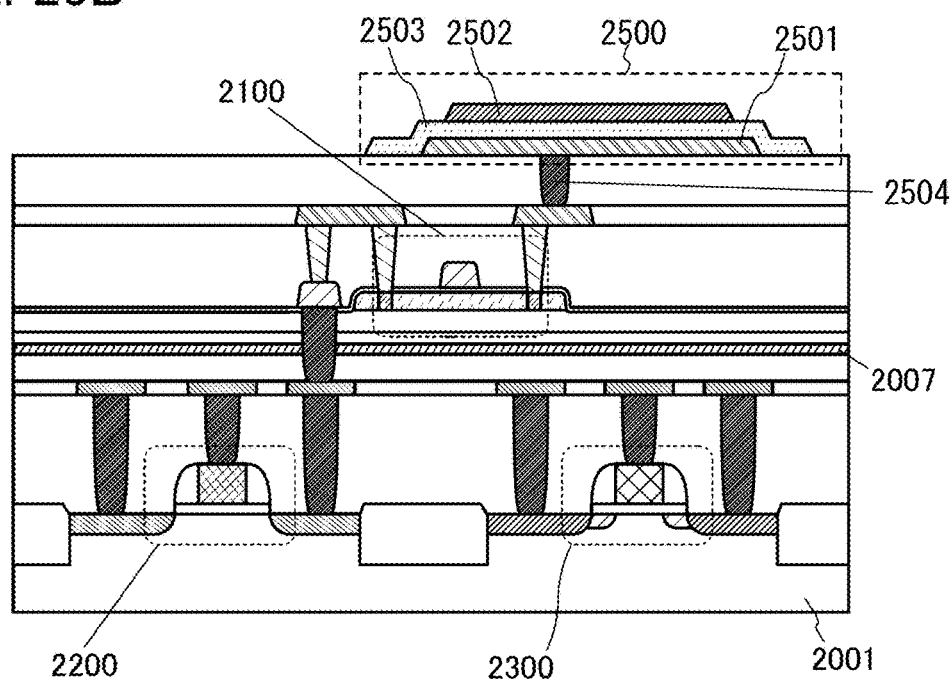

FIG. 25B is a cross-sectional view of a semiconductor device where a photodiode 2500 is provided above the transistor 2100. The photodiode 2500 includes a conductive film 2501 having a function as one of an anode and a cathode, a conductive film 2502 having a function as the other of the anode and the cathode, and a semiconductor layer 2503. Furthermore, the photodiode 2500 is electrically connected to the transistor 2100 through a plug 2504.

In FIG. 25B, the photodiode 2500 may be provided at the same level as the transistor 2100. Alternatively, the photodiode 2500 may be provided at the level between the transistor 2200 and the transistor 2100.

The description for FIG. 23A and FIG. 24 can be referred to for the details of other components in FIGS. 25A and 25B.

The photodiode 2400 or the photodiode 2500 may be formed using a material capable of generating charge by absorbing a radiation. Examples of the material capable of generating charge by absorbing a radiation include selenium, lead iodide, mercury iodine, gallium arsenide, CdTe, and CdZn.

The use of selenium for the photodiode 2400 or the photodiode 2500 can provide a photoelectric conversion element having a light absorption coefficient in a wide wavelength range of visible light, ultraviolet light, X-rays, and gamma rays, for example.

<Memory Device>

Figure 26A:
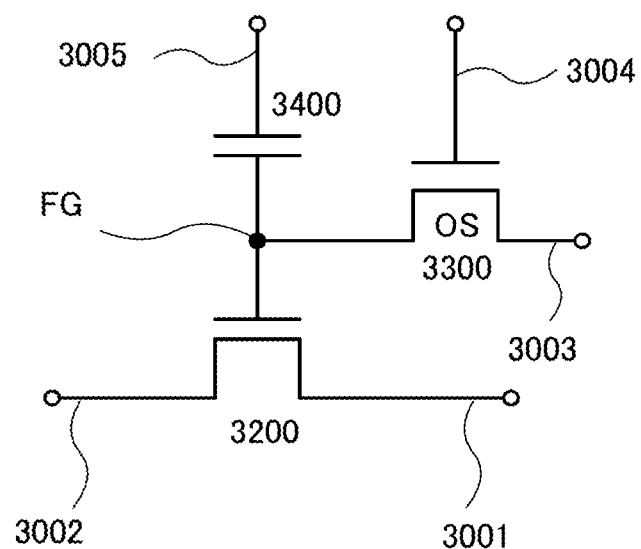
FIGS. 26A and 26B are circuit diagrams illustrating examples of memory devices.
Figure 26B:
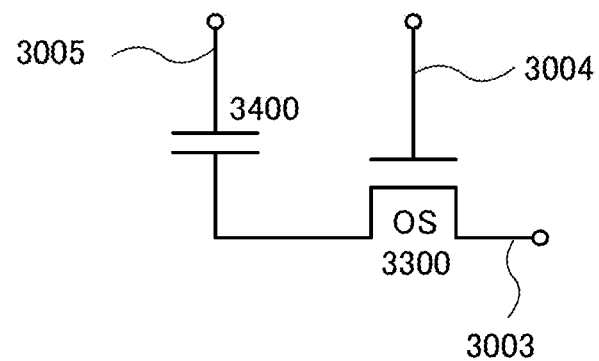

Examples of a semiconductor device (memory device) which includes the transistor of one embodiment of the present invention, which can retain stored data even when not powered, and which has an unlimited number of write cycles are shown in FIGS. 26A and 26B.

The semiconductor device illustrated in FIG. 26A includes a transistor 3200 containing a first semiconductor material, a transistor 3300 containing a second semiconductor material, and a capacitor 3400. Note that any of the above-described the transistor described in Embodiment 1 can be used as the transistor 3300.

In the transistor 3300, a channel is formed in a semiconductor layer including an oxide semiconductor. Since the off-state current of the transistor 3300 is low, stored data can be retained for a long time. In other words, power consumption can be sufficiently reduced because a semiconductor memory device in which refresh operation is unnecessary or the frequency of refresh operation is extremely low can be provided.

In FIG. 26A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to a first terminal of the capacitor 3400. A fifth wiring 3005 is electrically connected to a second terminal of the capacitor 3400.

The semiconductor device in FIG. 26A has a feature that the potential of the gate electrode of the transistor 3200 can be retained, and thus enables writing, retaining, and reading of data as follows.

Writing and retaining of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate of the transistor 3200 (writing). Here, one of two kinds of charge providing different potential levels (hereinafter referred to as low-level charge and high-level charge) is supplied. After that, the potential of the fourth wiring 3004 is set to a potential at which the transistor 3300 is turned off, so that the transistor 3300 is turned off. Thus, the charge supplied to the gate of the transistor 3200 is retained (retaining).

Since the off-state current of the transistor 3300 is extremely low, the charge of the gate of the transistor 3200 is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies in accordance with the amount of charge retained in the gate of the transistor 3200. This is because in general, when an n-channel transistor is used as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined For example, in the case where the high-level charge is supplied to the gate of the transistor 3200 in writing and the potential of the fifth wiring 3005 is $V_0$ ($>V_{th\_H}$), the transistor 3200 is turned on. In the case where the low-level charge is supplied to the gate of the transistor 3200 in writing, the transistor 3200 remains off even when the potential of the fifth wiring 3005 is $V_0$ ($<V_{th\_L}$). Thus, the data retained in the gate of the transistor 3200 can be read by determining the potential of the second wiring 3002.

Note that in the case where memory cells are arrayed, it is necessary that only data of a desired memory cell be able to be read. In the case where data is not read, the fifth wiring 3005 may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 26B is different from the semiconductor device illustrated in FIG. 26A in that the transistor 3200 is not provided. In this case, data writing and retaining operations can be performed in a manner similar to those of the semiconductor device illustrated in FIG. 26A.

Next, reading of data in the semiconductor device illustrated in FIG. 26B will be described. When the transistor 3300 is turned on, the third wiring 3003 which is in a floating state and the capacitor 3400 are electrically connected to each other, and charge is redistributed between the third wiring 3003 and the capacitor 3400. As a result, the potential of the third wiring 3003 is changed. The amount of change in potential of the third wiring 3003 depends on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 when the potential $V_1$ is retained ($=(C_B \times V_{B0} + C \times V_1)$ $(C_B + C)$) is higher than the potential of the third wiring 3003 when the potential $V_0$ is retained ($=(C_B \times V_{B0} + C \times V_0)/(C_B + C)$).

Then, by comparing the potential of the third wiring 3003 with a predetermined potential, data can be read.

In this case, a transistor containing the first semiconductor material may be used in a driver circuit for driving a memory cell, and a transistor containing the second semiconductor material may be stacked as the transistor 3300 over the driver circuit.

When a transistor having a channel formation region formed using an oxide semiconductor and having an extremely low off-state current is used in the semiconductor device described in this embodiment, the semiconductor device can retain stored data for an extremely long time. In other words, refresh operation becomes unnecessary or the frequency of the refresh operation can be extremely low, leading to a sufficient reduction in power consumption.

Moreover, stored data can be retained for a long time even when not powered (note that a potential is preferably fixed).

Furthermore, in the semiconductor device described in this embodiment, a high voltage is not needed for data writing and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device of the disclosed invention does not have a limit on the number of times data can be rewritten, which is a problem of a conventional nonvolatile memory, and the reliability thereof is drastically improved. Moreover, since data is written depending on the state of the transistor (on or off), high-speed operation can be easily achieved.

The memory device described in this embodiment can also be used in an LSI such as a central processing unit (CPU), a digital signal processor (DSP), a custom LSI, or a programmable logic device (PLD), and a radio frequency (RF) tag, for example.

The structures, methods, and the like described in this embodiment can be used as appropriate in combination with any of the structures, methods, and the like described in other embodiments.

(Embodiment 4)

In this embodiment, a CPU in which the transistor described in Embodiment 1 or 2 can be used and the memory device described in Embodiment 3 is included will be described.

Figure 27:
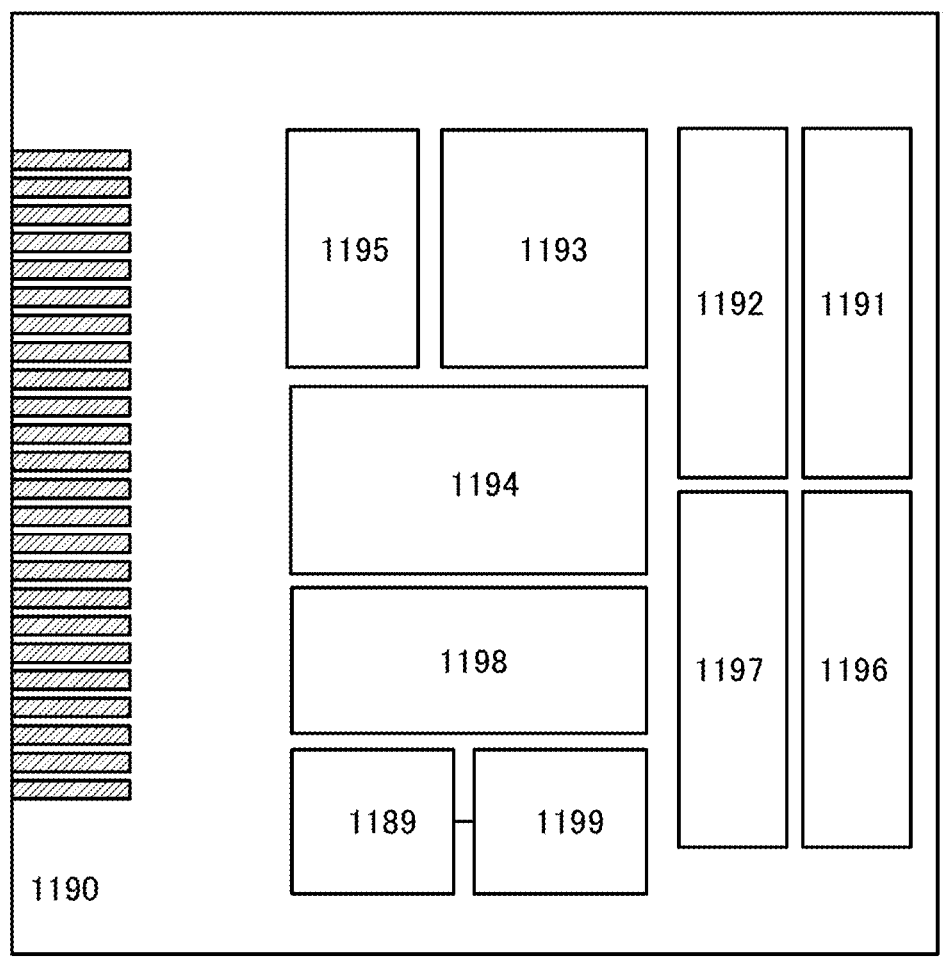
FIG. 27 is a block diagram illustrating an example of a CPU.

FIG. 27 is a block diagram illustrating a configuration example of a CPU at least partly including any of the transistors described in the above embodiments as a component.

The CPU illustrated in FIG. 27 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example in which the configuration is simplified, and an actual CPU may have a variety of configurations depending on the application. For example, the CPU may have the following configuration: a structure including the CPU illustrated in FIG. 27 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in response to the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 27, a memory cell is provided in the register 1196. For the memory cell of the register 1196, the transistor described in Embodiment 1 or 2 or the memory device described in Embodiment 3 can be used.

In the CPU illustrated in FIG. 27, the register controller 1197 selects operation of retaining data in the register 1196 in accordance with an instruction from the ALU 1191. That is, the register controller 1197 selects whether data is retained by a flip-flop or whether it is retained by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

The structures, methods, and the like described in this embodiment can be used as appropriate in combination with any of the structures, methods, and the like described in the other embodiments.

(Embodiment 5)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 28A to 28F illustrate specific examples of these electronic devices.

Figure 28A:
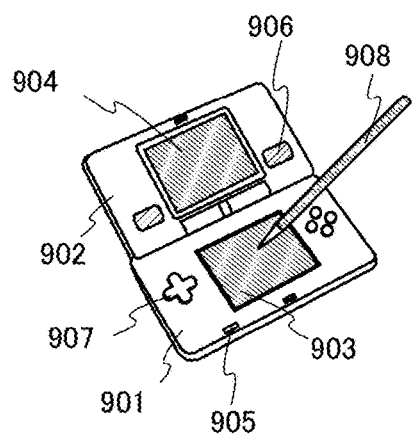
FIGS. 28A to 28F illustrate examples of electronic devices.

FIG. 28A illustrates a portable game machine which includes a housing 901, a housing 902, a display portion 903, a display portion 904, a microphone 905, a speaker 906, an operation key 907, a stylus 908, and the like. Although the portable game machine in FIG. 28A has the two display portions 903 and 904, the number of display portions included in a portable game machine is not limited to this.

Figure 28B:
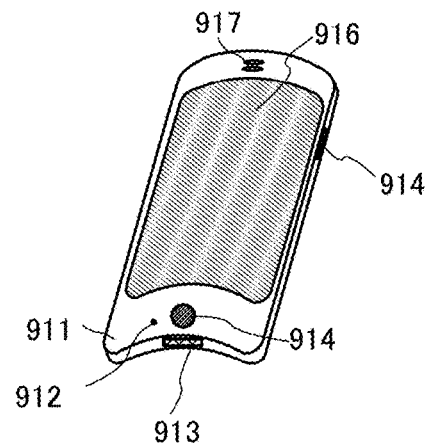

FIG. 28B illustrates a cellular phone which is provided with a housing 911, a display portion 916, operation buttons 914, an external connection port 913, a speaker 917, a microphone 912, and the like. When the display portion 916 of the cellular phone illustrated in FIG. 28B is touched with a finger or the like, data can be input. Furthermore, operations such as making a call and inputting text can be performed by touch on the display portion 916 with a finger or the like. With the operation button 914, the power can be turned on or off. In addition, the type of image displayed on the display portion 916 can be switched with the operation button 914; for example, switching images from a mail creation screen to a main menu screen can be performed.

Figure 28C:
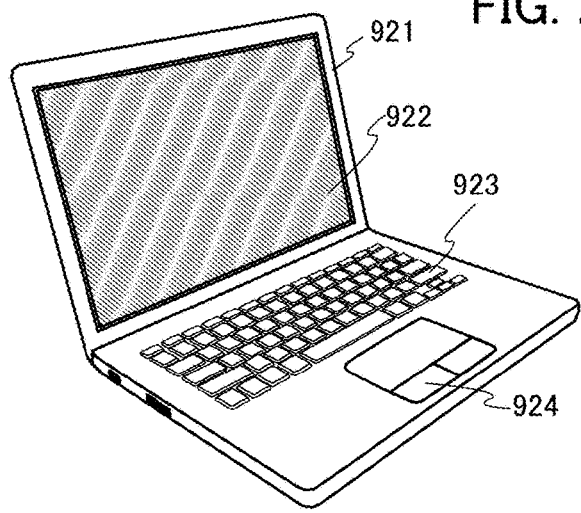

FIG. 28C illustrates a notebook personal computer which includes a housing 921, a display portion 922, a keyboard 923, a pointing device 924, and the like.

Figure 28D:
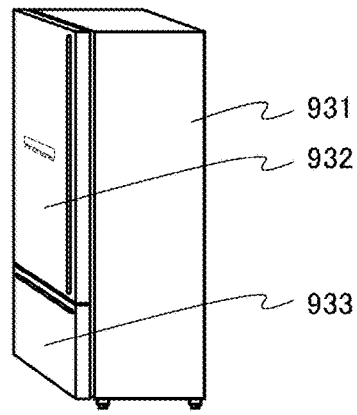

FIG. 28D illustrates an electric refrigerator-freezer which includes a housing 931, a refrigerator door 932, a freezer door 933, and the like.

Figure 28E:
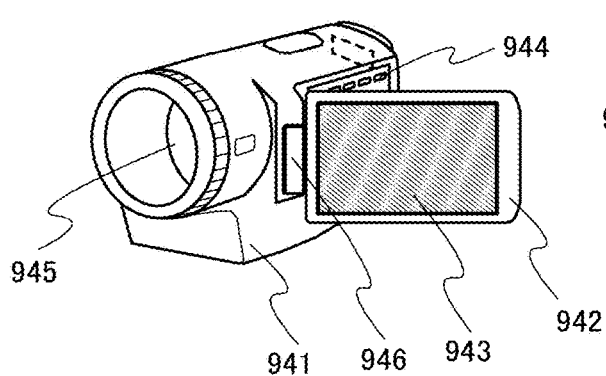

FIG. 28E illustrates a video camera which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 28F:
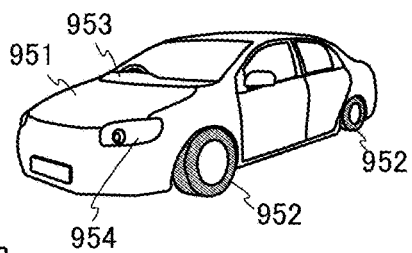
Figure 29A:
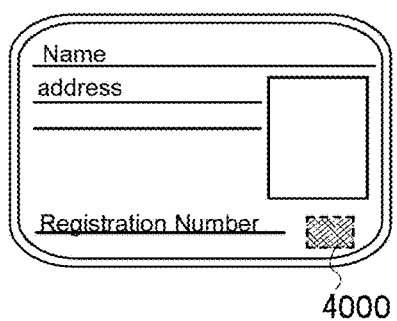
FIGS. 29A to 29F illustrate examples of an RF tag.
Figure 29B:
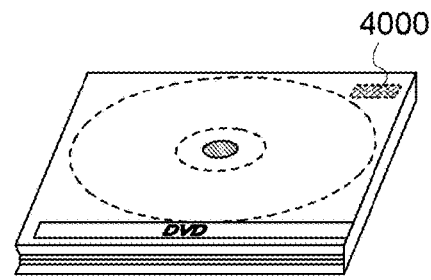
Figure 29C:
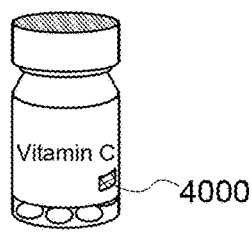
Figure 29D:
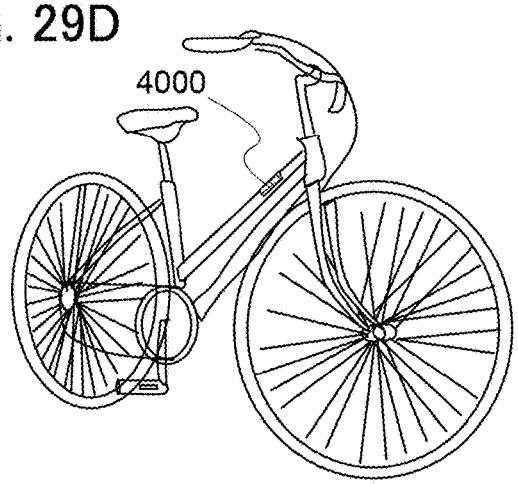
Figure 29E:
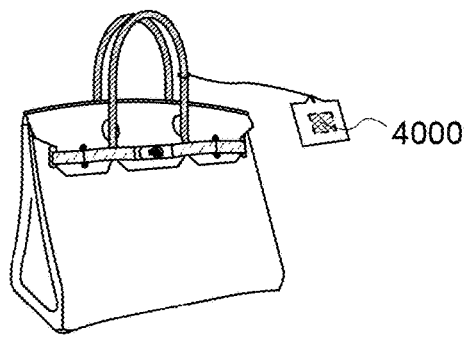
Figure 29F:
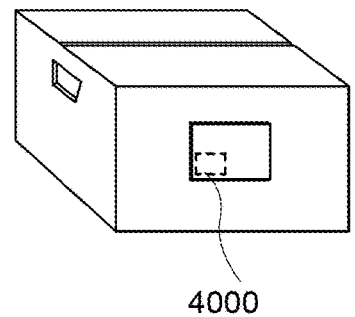

FIG. 28F illustrates a car, a vehicle, or the like which includes a car body 951, wheels 952, a dashboard 953, lights 954, and the like.

Note that this embodiment can be combined with any of the other embodiments in this specification as appropriate.

(Embodiment 6)

In this embodiment, application examples of an RF tag that can be formed using the semiconductor device of one embodiment of the present invention will be described with reference to FIGS. 29A to 29F. The RF tag is widely used and can be provided for, for example, products such as bills, coins, securities, bearer bonds, documents (e.g., driver's licenses or resident's cards, see FIG. 29A), recording media (e.g., DVDs or video tapes, see FIG. 29B), packaging containers (e.g., wrapping paper or bottles, see FIG. 29C), vehicles (e.g., bicycles, see FIG. 29D), personal belongings (e.g., bags or glasses), foods, plants, clothing, household goods, medical supplies such as medicine and chemicals, and electronic devices (e.g., liquid crystal display devices, EL display devices, television sets, or cellular phones), animals, human bodies, or tags on products (see FIGS. 29E and 29F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an example of use of a display device that can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on a current), an electron emitter, a liquid crystal element, electronic ink, an electrophoretic element, a grating light valve (GLV), a plasma display panel (PDP), a display element using a micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic effect may be included. Examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that this embodiment can be combined with any of the other embodiments in this specification as appropriate.

This application is based on Japanese Patent Application serial no. 2014-153753 filed with Japan Patent Office on Jul. 29, 2014, the entire contents of which are hereby incorporated by reference.

What is claimed is:

1. A method for manufacturing a semiconductor device, comprising:
forming an oxide semiconductor film;
forming a gate insulating film over the oxide semiconductor film;
forming a gate electrode over the gate insulating film;
forming an interlayer insulating film over the oxide semiconductor film and the gate electrode;
performing planarization treatment on the interlayer insulating film;
forming a first opening and a second opening in the interlayer insulating film subjected to the planarization treatment;
forming a first conductive film in the first opening and the second opening and over the interlayer insulating film subjected to the planarization treatment;
forming a second conductive film and a third conductive film by performing planarization treatment on the first conductive film; and
forming a first region and a second region in the oxide semiconductor film by adding an impurity to the second conductive film and the third conductive film,
wherein the first region and the first opening overlap with each other, and
wherein the first region is formed by an impact caused by addition of the impurity to the second conductive film.

2. The method for manufacturing a semiconductor device, according to claim 1, wherein the impurity is added by an ion doping method or an ion implantation method.

3. The method for manufacturing a semiconductor device, according to claim 1, wherein the impurity is argon.

4. The method for manufacturing a semiconductor device, according to claim 1,
wherein resistance of the first region of the oxide semiconductor film is lower than resistance of a third region of the oxide semiconductor film, and
wherein the gate electrode and the third region of the oxide semiconductor film overlap with each other.

5. A method for manufacturing a semiconductor device, comprising:
forming a gate electrode;
forming a gate insulating film over the gate electrode;
forming an oxide semiconductor film over the gate insulating film;
forming an interlayer insulating film over the oxide semiconductor film;
performing planarization treatment on the interlayer insulating film;
forming a first opening and a second opening in the interlayer insulating film subjected to the planarization treatment;
forming a first conductive film in the first opening and the second opening and over the interlayer insulating film subjected to the planarization treatment;
forming a second conductive film and a third conductive film by performing planarization treatment on the first conductive film; and
forming a first region and a second region in the oxide semiconductor film by adding an impurity to the second conductive film and the third conductive film,
wherein the first region and the first opening overlap with each other, and
wherein the first region is formed by an impact caused by addition of the impurity to the second conductive film.

6. The method for manufacturing a semiconductor device, according to claim 5, wherein the impurity is added by an ion doping method or an ion implantation method.

7. The method for manufacturing a semiconductor device, according to claim 5, wherein the impurity is argon.

8. The method for manufacturing a semiconductor device, according to claim 5,
wherein resistance of the first region of the oxide semiconductor film is lower than resistance of a third region of the oxide semiconductor film, and
wherein the gate electrode and the third region of the oxide semiconductor film overlap with each other.

9. A method for manufacturing a semiconductor device, comprising:
forming an oxide semiconductor film;
forming an interlayer insulating film over the oxide semiconductor film;
forming a first opening and a second opening in the interlayer insulating film;
forming a first conductive film in the first opening and the second opening and over the interlayer insulating film;
forming a second conductive film in the first opening and a third conductive film in the second opening by removing part of the first conductive film and dividing the first conductive film; and
adding an impurity to the second conductive film and the third conductive film to form a first region and a second region in the oxide semiconductor film,
wherein the impurity is argon,
wherein the first region of the oxide semiconductor film is in contact with the second conductive film,
wherein the second region of the oxide semiconductor film is in contact with the third conductive film,
wherein a third region of the oxide semiconductor film is between the first region and the second region of the oxide semiconductor film,
wherein resistance of the first region of the oxide semiconductor film is lower than resistance of the third region of the oxide semiconductor film,
wherein resistance of the second region of the oxide semiconductor film is lower than the resistance of the third region of the oxide semiconductor film, and
wherein the second conductive film and the third conductive film are formed by performing planarization treatment on the first conductive film.

10. The method for manufacturing a semiconductor device, according to claim 9, wherein the impurity is added by an ion doping method or an ion implantation method.

11. The method for manufacturing a semiconductor device, according to claim 9, further comprising forming a gate electrode before forming the oxide semiconductor film.

12. The method for manufacturing a semiconductor device, according to claim 9, further comprising forming a gate electrode after forming the oxide semiconductor film.

13. The method for manufacturing a semiconductor device, according to claim 9,
wherein the first region is formed in the oxide semiconductor film by an impact caused by addition of the impurity to the second conductive film, and
wherein the second region is formed in the oxide semiconductor film by an impact caused by addition of the impurity to the third conductive film.

* * * * *